(12) United States Patent
Ko et al.

(10) Patent No.: US 11,223,016 B2
(45) Date of Patent: Jan. 11, 2022

(54) LONG-TERM EFFICIENT COMPOSITION FOR ACTIVE LAYER AND ORGANIC SOLAR CELL INCLUDING THE SAME

(71) Applicant: UNIVERSITY-INDUSTRY COOPERATION GROUP OF KYUNG HEE UNIVERSITY, Yongin (KR)

(72) Inventors: Doo Hyun Ko, Seongnam (KR); Min Jeong Cha, Uiwang (KR); Min Woo Nam, Seoul (KR)

(73) Assignee: UNIVERSITY-INDUSTRY COOPERATION GROUP OF KYUNG HEE UNIVERSITY, Yongin (KR)

( * ) Notice: Subject to any disclaimer, the term of this patent is extended or adjusted under 35 U.S.C. 154(b) by 304 days.

(21) Appl. No.: 16/340,054

(22) PCT Filed: Sep. 13, 2017

(86) PCT No.: PCT/KR2017/010024
§ 371 (c)(1),
(2) Date: Apr. 5, 2019

(87) PCT Pub. No.: WO2018/066826
PCT Pub. Date: Apr. 12, 2018

(65) Prior Publication Data
US 2020/0168801 A1 May 28, 2020

(30) Foreign Application Priority Data

Oct. 6, 2016 (KR) .......................... 10-2016-0128790

(51) Int. Cl.
*H01L 51/00* (2006.01)
*H01L 51/42* (2006.01)
*H01L 51/44* (2006.01)

(52) U.S. Cl.
CPC ...... *H01L 51/0036* (2013.01); *H01L 51/0046* (2013.01); *H01L 51/424* (2013.01); *H01L 51/441* (2013.01)

(58) Field of Classification Search
CPC .................................................. H01L 51/424
See application file for complete search history.

(56) References Cited

FOREIGN PATENT DOCUMENTS

| KR | 20130027213 A | 3/2013 |
| KR | 20150072731 A | 6/2015 |
| KR | 20160027958 A | 3/2016 |

OTHER PUBLICATIONS

International Search Report; PCT/KR2017/010024; dated 2017.
Satoshi Honda, et al.; The Royal Society of Chemistry; ChemComm; "Multi-Colored Dye Sensitization of Polymer/Fullerene Bulk Heterojunction Solar Cells"; 2010.
Jiayu Qiu, et al.; Journal of Photopolymer Science and Technology; "Bulk-Hertojunction Solar Cells Based on Ternary Blend Active Layers ofPTB 7, PC61BM, and PC7 1BM"; vol. 28, No. 3; 2015.

*Primary Examiner* — Peter F Godenschwager

(57) ABSTRACT

Disclosed herein are an at least quaternary composition that comprises at least two donor components and at least two low-molecular-weight fullerene acceptor components and is able to allow for superior photovoltaic performance over a long period of time, and an organic solve cell comprising an active layer formed thereof.

20 Claims, 20 Drawing Sheets

US 11,223,016 B2

LONG-TERM EFFICIENT COMPOSITION FOR ACTIVE LAYER AND ORGANIC SOLAR CELL INCLUDING THE SAME

CROSS-REFERENCE TO RELATED APPLICATIONS

The present application is a U.S. National Stage of PCT/KR2017/010024 filed Sep. 13, 2017, which claims priority benefit of Korean Patent Application No. 10-2016-0128790, filed on Oct. 6, 2016 in the Korean Intellectual Property Office.

TECHNICAL FIELD

The present disclosure pertains to a composition for an active layer of organic photovoltaics and an organic photovoltaic comprising the same. More particularly, the present disclosure is concerned with an at least quaternary composition capable of providing efficient photovoltaic performance over a long period of time, with at least two donors and at least two low-molecular-weight fullerene acceptors introduced thereinto, and an organic photovoltaic comprising an active layer formed therefrom.

BACKGROUND ART

With the worldwide increase of energy consumption and the rapid expansion of transport means, such as automobiles, according to recent industrialization, the depletion of fossil energy resources, such as petroleum, coal, etc. has worsened. Furthermore, the use of fossil energy has caused environmental pollution problems such as greenhouse gas, etc. Hence, extensive interest has arisen in the development of clean energy substituting for conventional fossil energy sources. Further, intensive attention has been paid to the development of technologies capable of producing clean energy at low cost. Nowadays, electric power consumption is about 13 Terawatts (TW) and is predicted to increase to 30 TW or greater by 2050.

The sun is representative of such alternative energy sources and thus, solar cells are under the spotlight. A solar cell is an electrical device that directly converts the energy of light into electricity by the photovoltaic effect.

The world solar market has sharply increased by about 35 to 40% annually on average. Solar cells using crystalline silicon substrates predominate in the current solar cell market. For a brief description of the operating mechanism, when light is incident on a solar cell from the outside, the incident photoenergy excites a valance band electron in a p-type semiconductor to the conduction band and the excited electron generates an electron-hole pair inside the p-type semiconductor.

The electron in the electron-hole pair is transferred to the n-type semiconductor by the electric field present in p-n junction, supplying an electric current to the outside. The p-type semiconductor and the n-type semiconductor combine with each other to create a junction. In this regard, an excess of electrons present in the n-type semiconductor diffuse to the p-type semiconductor while an excess of holes present in the p-type semiconductor diffuses to the n-type semiconductor.

The vacant sites left behind the diffusion of electrons and holes are charged with cations and anions, respectively, like a battery. At the vicinity of the junction, a voltage from the cation to the anion is generated.

For the above-mentioned crystalline silicon-based solar cells, however, the cost of the substrate occupies a high portion in the total production cost and the need of intermittent and complicate processes, such as ingot-wafer-cell-module, etc., is a limitative barrier against securing profitability.

As one alternative to silicon-based solar cells, organic photovoltaics are also being actively studied. Solar organic cells employ conductive polymers that are of high electrical conductivity in spite of being organic materials, or organic semiconductor materials that can fabricated into semiconductor devices. As such, organic photovoltaics are expected to be used in so-called BIPV, which is installed at windows, walls, balconies, etc. in buildings, accounting for splendid appearance of the buildings as well as generating electricity. Having the advantage of being able to be fabricated in the form of thin films hundreds nm or less in thickness and being applicable to flexible structures, particularly, organic photovoltaics are suggested as a potential energy source for mobile information systems in the future and expected to find various applications.

In recent years, the introduction of fullerene (C60) into organic photovoltaics has made a swift progress. Steady development has been on technologies of increasing the efficiency of various organic thin-film solar cells by introducing single molecules such as CuPc, polymer materials such as PPV, P3HT, etc. into C60 or C60 derivatives.

Organic semiconductors used in an active layer of organic photovoltaics include organic single molecules and polymers. Organic single molecules are heated in a vacuum to consecutively form a donor layer and an acceptor. As for organic polymers, a solution containing donor and acceptor materials together is subjected to spin coating, inkjet printing, or screen printing to form a thin film.

When light is incident on an organic photovoltaic, a donor material absorbs a photon to create an electron-hole pair ("exciton"), which is an energy bulk in an excited state. The exciton diffuses toward arbitrary directions and separates into an electron and a hole at a boundary to the acceptor material. That is, an acceptor component with large electron affinity rapidly attracts the electron to induce charge separation. The hole remaining in the donor component layer migrates to the anode by the internal electric field formed by due to a difference in work function between opposite electrodes and by a concentration difference of accumulated charges while the electron travels the acceptor layer to the cathode and collected thereat. The charges thus collected finally flow as a current through an external circuit.

In this regard, the active layer has a bilayer structure of a donor (D) material and an acceptor (A) material (D/A bilayer) or a composite thin film ((D+A) blend), which is 100 nm thick in total, optionally with the interposition of buffer layers including a hole transport layer between the cathode and the active layer and an electron transport layer between the anode and the active layer. Particularly, the blend structure is also known as a "bulk-heterojunction (BHJ)" structure in which regions of each the donor material and the acceptor material are separated by 10 nanometers or less, resulting in the effect that the interface area between the donor and the acceptor increases several times greater compared to the bilayer structure. Therefore, the blend structure is known to increase the possibility of charge separation as well as serving to increasing light absorption efficiency due to micro light scattering.

In this context, for semiconductor polymers, research have been made of poly(p-phenylene vinylene) (PPV)-based components and polythiophene (PT) derivatives as donor materials. Polyfluorene (PF)-based components and copolymers thereof are also used as low-band gap donor components. These donor components must primarily have a light absorption wavelength range incident with the solar light spectrum and be superior in terms of electrical properties including the mobility of charges, etc. Meanwhile, fullerene (C60) or a derivative thereof (PCBM) is used as the acceptor material. Particularly, the derivatives of C60 in combination with semiconductor polymers are widely used as BHJ structural materials.

As a strategy for increasing the efficiency of organic photovoltaics using such a BHJ structure, a tandem structure in which two or more active layers are stacked has been developed. Reportedly, such active layers in a tandem structure are different in absorption region from each other and thus can absorb solar light in a reciprocally supplemental manner, with the consequent improvement of power conversion efficiency. However, when two or more active layers are consecutively stacked to fabricate a tandem structure, the lower active layer may be apt to be damaged. A fabrication process for alleviating this problem is also complicated. Hence, there is still a problem for commercialization.

In contrast to the above-mentioned tandem approach, recent research has reported that since the initial invention of bulk-heterojunction (BHJ) solar cells, new conjugated polymers and fullerene (or derivatives thereof) are combined to form an active layer whereby the organic photovoltaics can be improved in performance, specifically power conversion efficiency (PCE). There is a technique known to improve the performance of a solar cell in that a ternary composition that is prepared by additionally incorporating the basic binary composition composed of a polymer and fullerene with a different conjugated polymer donor component or a fullerene-based acceptor component is used as an active layer.

For instance, Korean Patent No. 2015-117361 A introduces a ternary active layer composition in which poly[(4,8-bis-(2-ethylhexyloxy)-benzo[1,2-b:4,5-b']dithiophen)-2,6-diyl-alt-(N-2-ethylhexylthieno[3,4-c]pyrrole-2,6-diyl]] (PBDTTPD), which is a polymer acting as a charge-bridge, is added to a binary active layer composition composed of poly(3-hexylthiophene) (P3HT) as a polymer donor and 1-(3-methoxycarbonyl)-propyl-1-phenyl-(6,6) C61 ($PC_{61}BM$), which is a fullerene derivative serving as a low-molecular-weight acceptor, stating that the solar cell is improved in power conversion efficiency although low in the low-molecular-weight acceptor content.

In addition, Korean Patent No. 1549659 discloses an organic photovoltaic in which a ternary composition comprising one polymer donor and two fullerene adducts as an acceptor is used as an active layer. According to the patent document, it is stated that the addition of an additional low-molecular-weight acceptor component to the binary basic active layer composition can improve power conversion efficiency without degrading the short-circuit current density (Jsc) and the fill factor (FF).

The foregoing ternary composition is advantageous in view of broadening the light absorption band, improving the nanomorphology of the blend, increasing the open-circuit voltage ($V_{OC}$), and/or boosting the charge transfer. Particularly, ternary organic photovoltaics based on the efficient non-crystalline polymer host (e.g., poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]]; PTB7) are reported to exhibit a power conversion efficiency of about 10%, which would meet commercialization requirements.

Besides the demand for high power conversion efficiency, it is also critical to preserve an optimized morphology of the pristine active layer during the operation of the organic photovoltaic. The domains of the polymer and fullerenes grow during operation due to their thermodynamic instability at elevated temperatures, which is a major degradation mechanism limiting the commercialization viability of the organic photovoltaics. Particularly at outdoor operating temperatures exceeding the glass transition temperature (Tg) of typical polymers, both non-crystalline polymers and fullerene derivatives are readily clustered, accompanying a reduction in the interfacial areas and an increase in the percolation threshold for charge carrier transport.

As such, research into an increase in the lifespan of organic photovoltaics mainly by altering the stack structure or by aggregating or coalescing fullerene electron acceptor is ongoing.

However, the above-mentioned conventional techniques, particularly, the ternary composition (2D & 1A or 1D & 2A) in which an additional polymer donor component or low-molecular-weight acceptor component is incorporated into a basic binary active layer composition composed of a polymer donor component and a low-molecular-weight fullerene acceptor is still required for advance in photovoltaic performance or in maintaining photovoltaic performance over a long period of time.

DETAILED DESCRIPTION OF THE INVENTION

Technical Problem

The present disclosure aims to provide an at least quaternary composition that is used in an active for organic photovoltaics and capable of exhibiting better photovoltaic efficiency over a longer period of time compared to conventional binary and ternary active layer compositions.

Technical Solution

A first aspect of the present disclosure provides an at least quaternary composition for use in an active layer of an organic photovoltaic, the composition comprising:

(I) a first and a second donor component that absorb light to create an exciton and donate the electron separated from the exciton formed; and (II) a first and a second low-molecular-weight fullerene acceptor component that receive the electron donated by the donor component, wherein, the first donor component is a material having a bandgap of 1.1 to 2.5 eV, the second donor component is a material having a LUMO (lowest unoccupied molecular orbital) identical to or lower than that of the first donor component, the first low-molecular-weight fullerene acceptor component has a cascade energy level structure with the second donor component and the second donor component has a HOMO (highest occupied molecular orbital) identical to or higher than that of the first low-molecular-weight fullerene acceptor component, and the second low-molecular-weight fullerene acceptor component has a cascade energy level structure with the first low-molecular-weight fullerene component and a LUMO higher than the HOMO of the first low-molecular-weight acceptor component.

According to an illustrative embodiment, the component (I) and the component (II) are contained at a mass ratio of 1:1 to 1:3 in the at least quaternary composition, the content of the first donor component in the component (I) ranges from 1 to 99% by mass, and the content of the first low-molecular-weight in the component (II) ranges from 1 to 99% by mass.

According to a second aspect of the present disclosure, provided is an organic photovoltaic comprising:

a pair of electrodes including a cathode and an anode different in work function from each other; and an at least quaternary active layer disposed between the pair of electrodes and comprising (I) a first and a second donor component that absorb light to create an exciton and donate the electron separated from the exciton formed; and (II) a first and a second low-molecular-weight fullerene acceptor component that receive the electron donated by the donor component, wherein, the first donor component is a material having a bandgap of 1.1 to 2.5 eV, the second donor component is a material having a LUMO (lowest unoccupied molecular orbital) identical to or lower than that of the first donor component, the first low-molecular-weight fullerene acceptor component has a cascade energy level structure with the second donor component and the second donor component has a HOMO (highest occupied molecular orbital) identical to or higher than that of the first low-molecular-weight fullerene acceptor component, and the second low-molecular-weight fullerene acceptor component has a cascade energy level structure with the first low-molecular-weight fullerene component and a LUMO higher than the HOMO of the first low-molecular-weight acceptor component.

In an illustrative embodiment, the LUMO of the second donor component may be higher than the LUMO of the first low-molecular-weight fullerene acceptor component.

In an illustrative embodiment, the LUMO of the second donor component may be identical to or lower by up to 50% than that of the first donor component and may be higher by at least 0.3 eV than that of the first low-molecular-weight fullerene acceptor component.

In an illustrative embodiment, the HOMO of the second donor component may be higher by at least 0.3 eV than that of the first low-molecular-weight fullerene acceptor component.

In an illustrative embodiment, the second low-molecular-weight fullerene acceptor component may have LUMO lower than that of the first donor component.

In an illustrative embodiment, the LUMO of the second low-molecular-weight fullerene acceptor component may be higher by up to 50% than the HOMO of the first low-molecular-weight fullerene acceptor component and may be lower by at least 0.3 eV than the LUMO of the first donor component.

In an illustrative embodiment, the HOMO of the second low-molecular-weight fullerene acceptor component may be lower than the LUMO of the first low-molecular-weight fullerene acceptor component.

In an illustrative embodiment, the HOMO of the second low-molecular-weight fullerene acceptor component may be lower by up to 50% than the LUMO of the first low-molecular-weight fullerene acceptor component.

According to an illustrative embodiment, the second donor component may have a bandgap of 1.2 to 2.6 eV.

According to an illustrative embodiment, the first low-molecular-weight fullerene acceptor component and the second low-molecular-weight fullerene acceptor component may each have a bandgap of 1.5 to 2.5 eV.

According to an illustrative embodiment, the first donor component may be poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]]; PTB7).

In an illustrative embodiment, the second donor component may be a polymer material including poly[N-9'-heptadecanyl-2,7-carbazole-alt-5,5-(4',7'-di-2-thienyl-2',1',3'-benzothiadiazole)] (PCDTBT).

In an illustrative embodiment, the first low-molecular-weight fullerene acceptor component may be [6,6]-phenyl C71butyricacidmethylester ($PC_{71}BM$).

In an illustrative embodiment, second low-molecular-weight fullerene acceptor component may be [6,6]-phenyl C61 butyricacidmethylester ($PC_{61}BM$).

In an illustrative embodiment, the organic photovoltaic may have a power conversion efficiency of at least 6% after thermal treatment at 65° C. or higher for one year.

In an illustrative embodiment, the point at which the power conversion efficiency (PCE) of the organic photovoltaic has fallen to 60% of the pristine value ($T_{60}$) may be at least one year.

In an illustrative embodiment, the organic photovoltaic, the first donor component and the low-molecular-weight fullerene acceptor component may range in nanocrystallite size from 34 to 40 Å and from 18 to 21 Å, respectively, after the organic photovoltaic is thermally treated at 65° C. or higher for 100 hours.

According to an illustrative embodiment, the at least quaternary composition may have a pristine hole mobility ($\mu_h$)/electron mobility ($\mu_e$) ratio of from 0.8 to 2.

Advantageous Effect

According to the present disclosure, at least quaternary composition (or blend) prepared simply by mixing at least two different donor components and at least two different low-molecular-weight fullerene acceptor components, all of which satisfy particular energy absorption requirements, at a particular ratio is used as an active layer in an organic photovoltaic, resulting in broadening the absorption spectrum, promoting exciton dissociation and charge transport, and retaining optimized morphology.

As such, the at least quaternary active layer composition (or blend) for an active layer of an organic photovoltaic, according to the present disclosure, can provide a novel platform that can stably maintain superb photovoltaic parameters or performance over a long period of time. In particular, the enhancement of stability is attributed to the fact that the donor components and the low-molecular-weight fullerene acceptor components in the at least quaternary composition are restricted from phase separating from each other and undergoing domain growth and can be applied to organic photovoltaics which are thus expected to be broadly commercialized.

Figure 4:
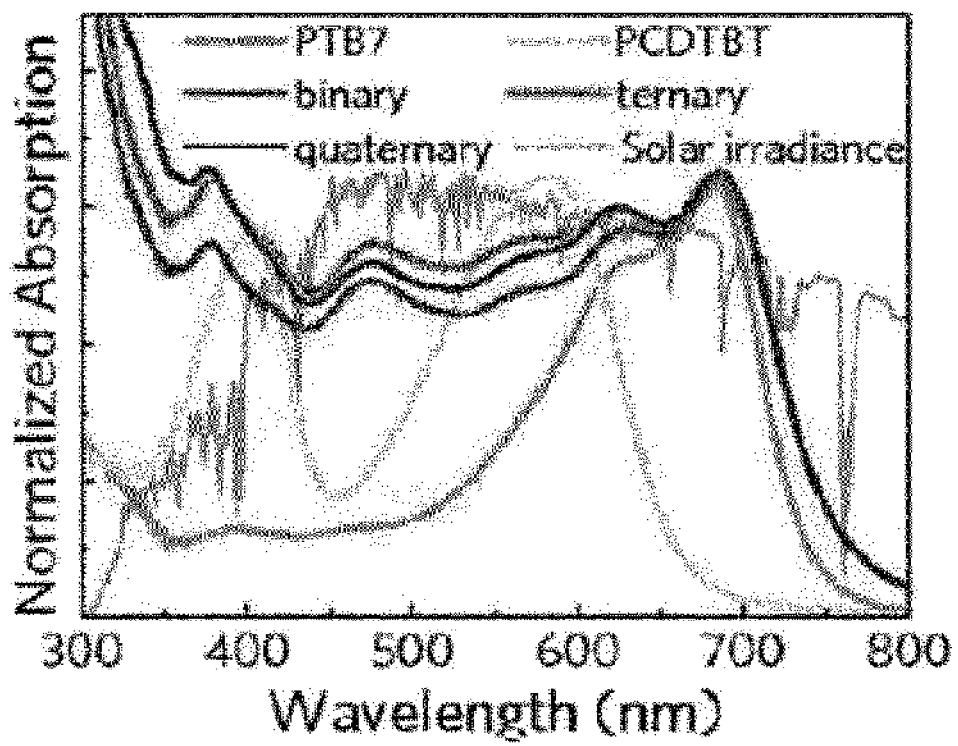
Figure 5:
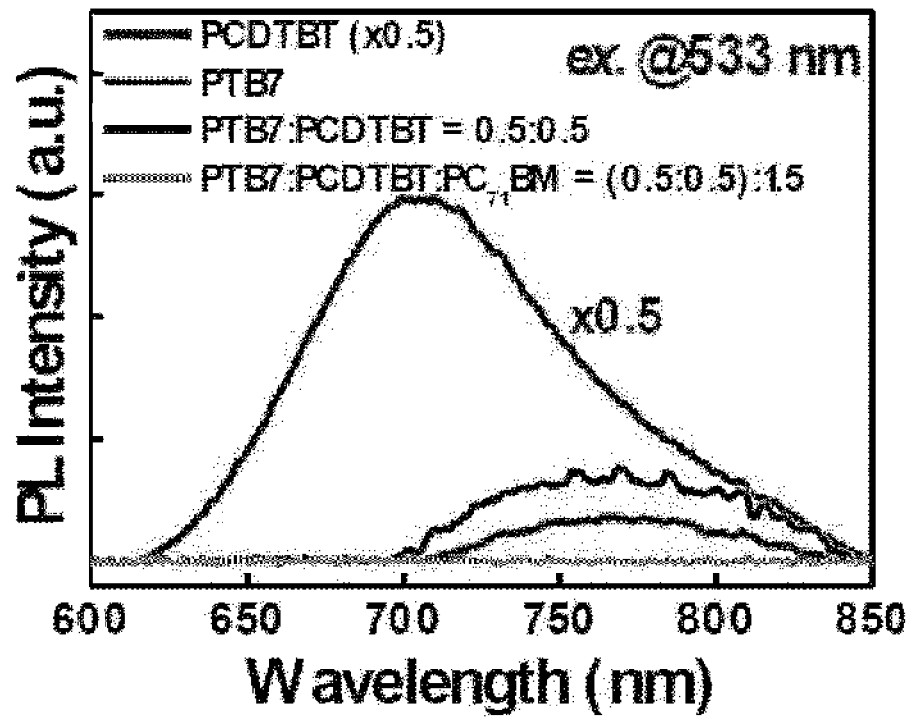
Figure 7:
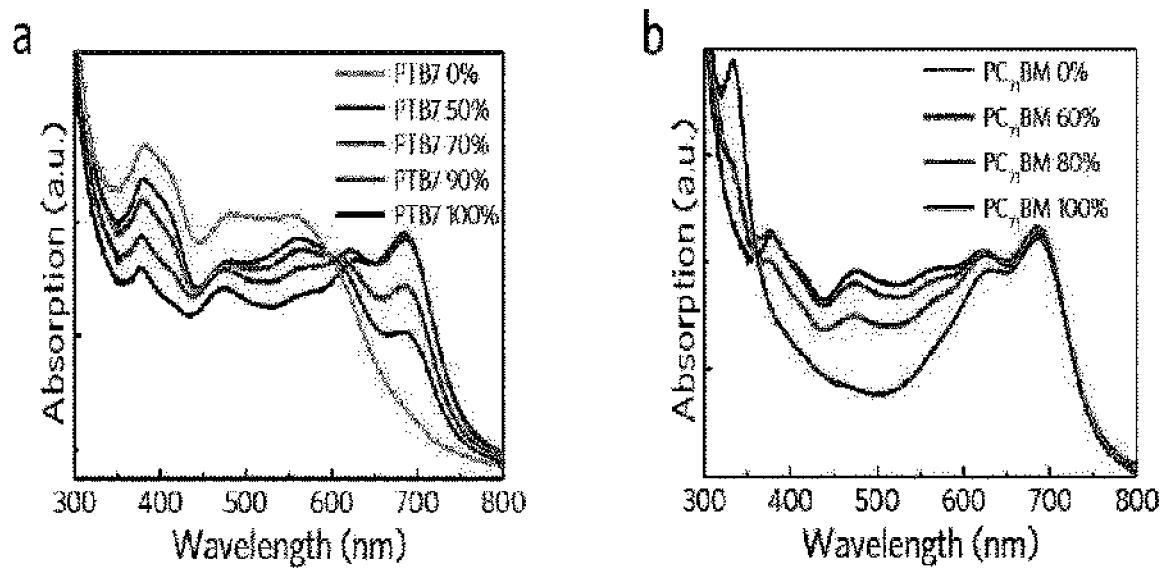
Figure 9:
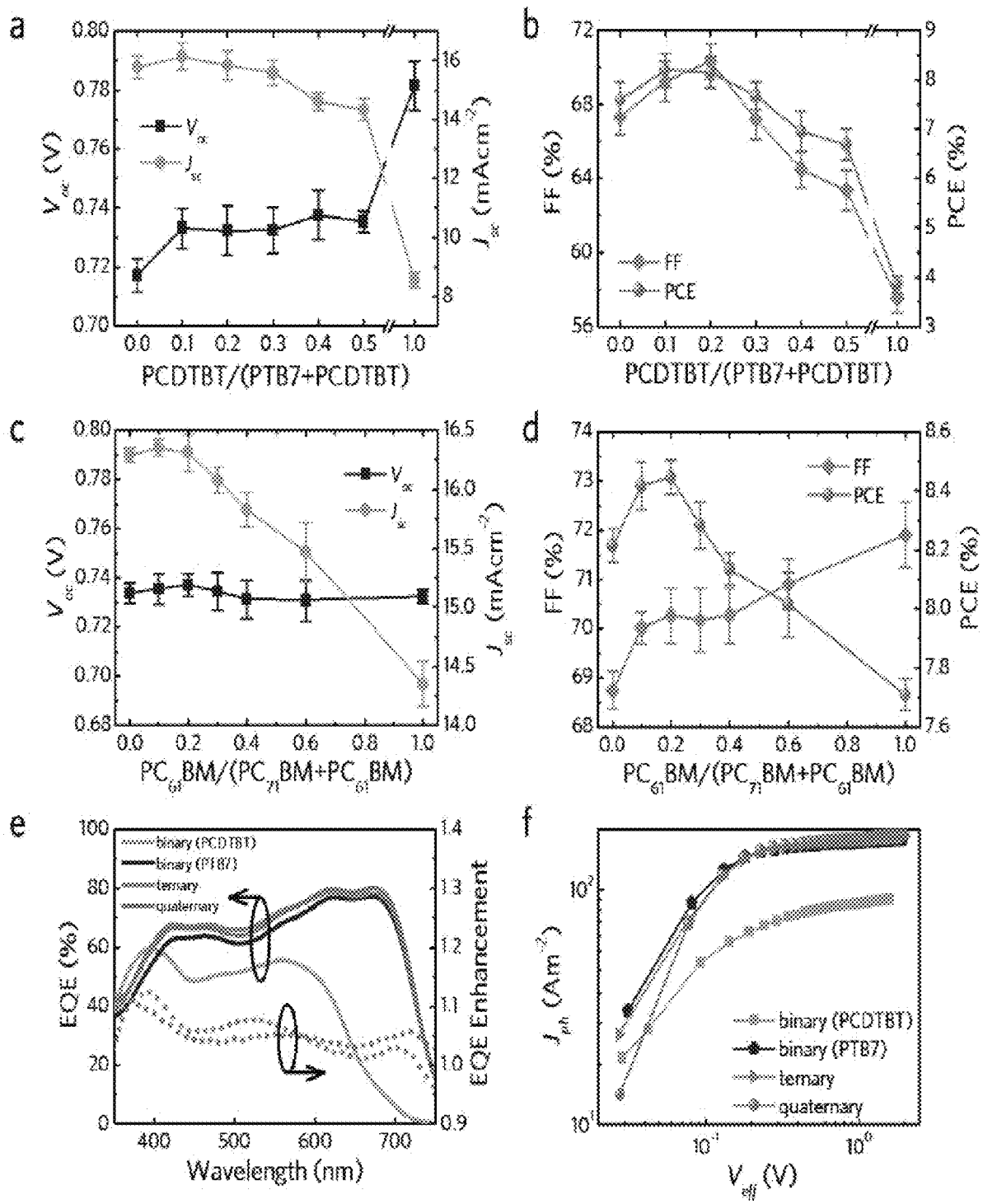
Figure 10:
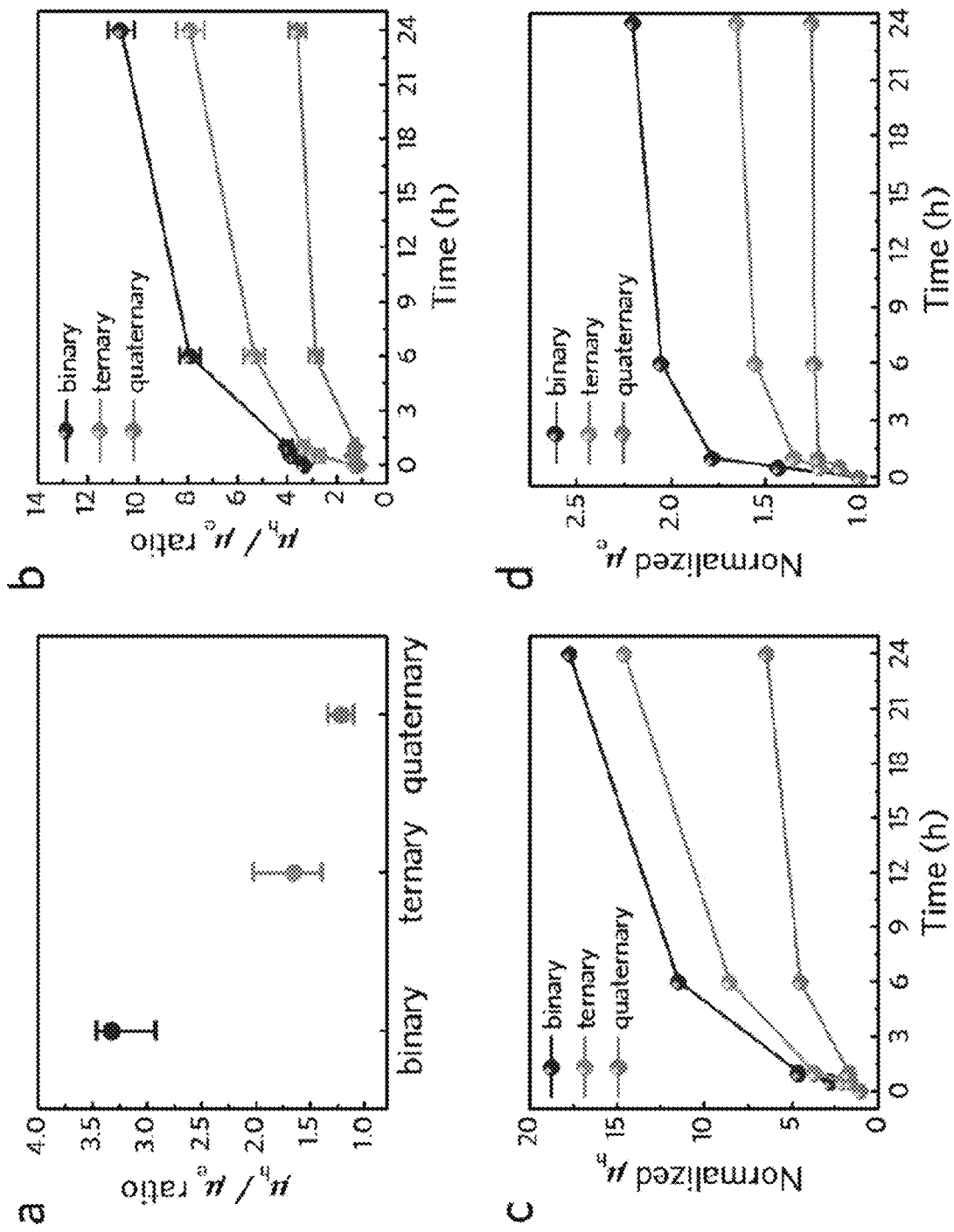
Figure 11:
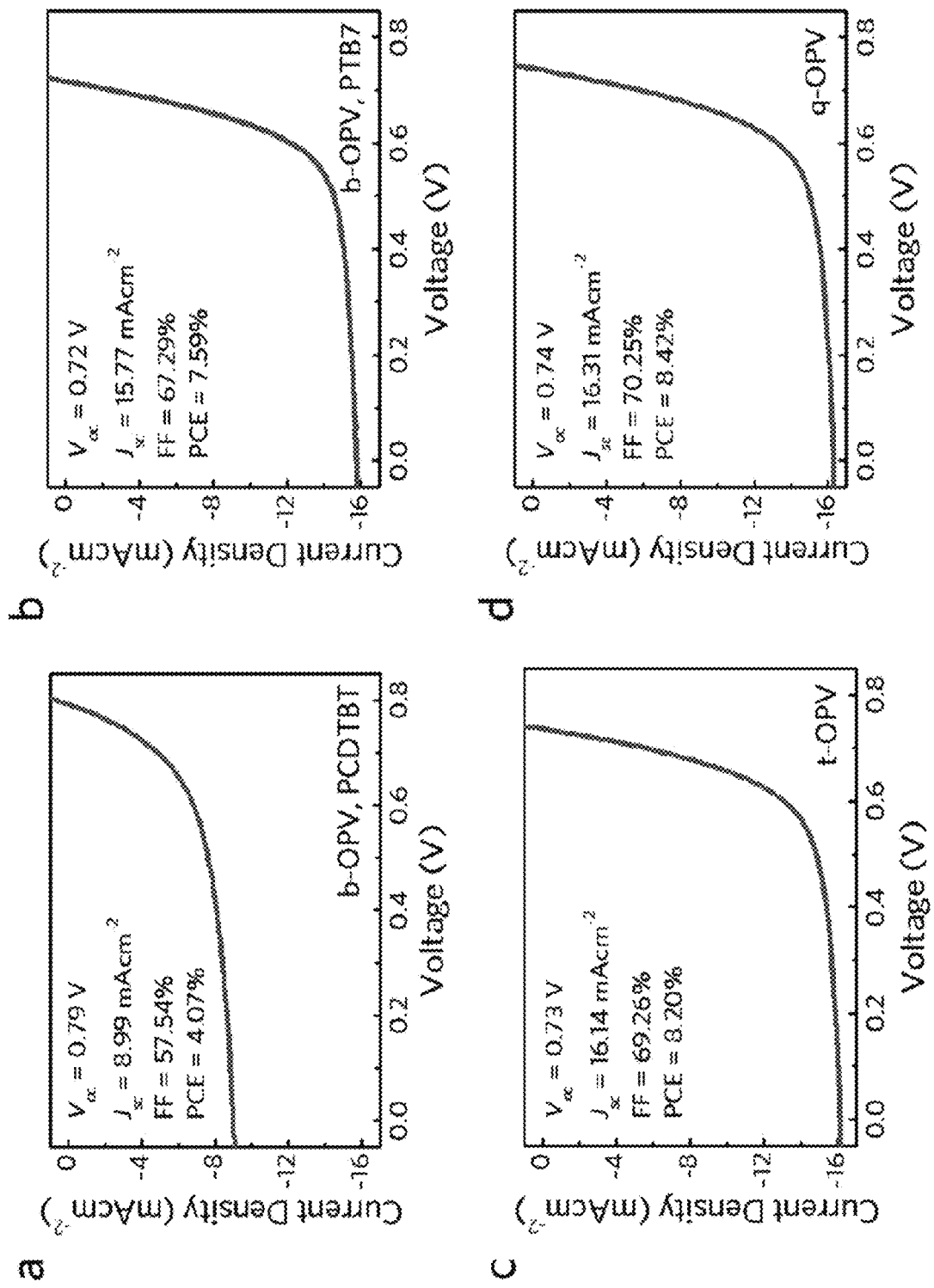
Figure 16:
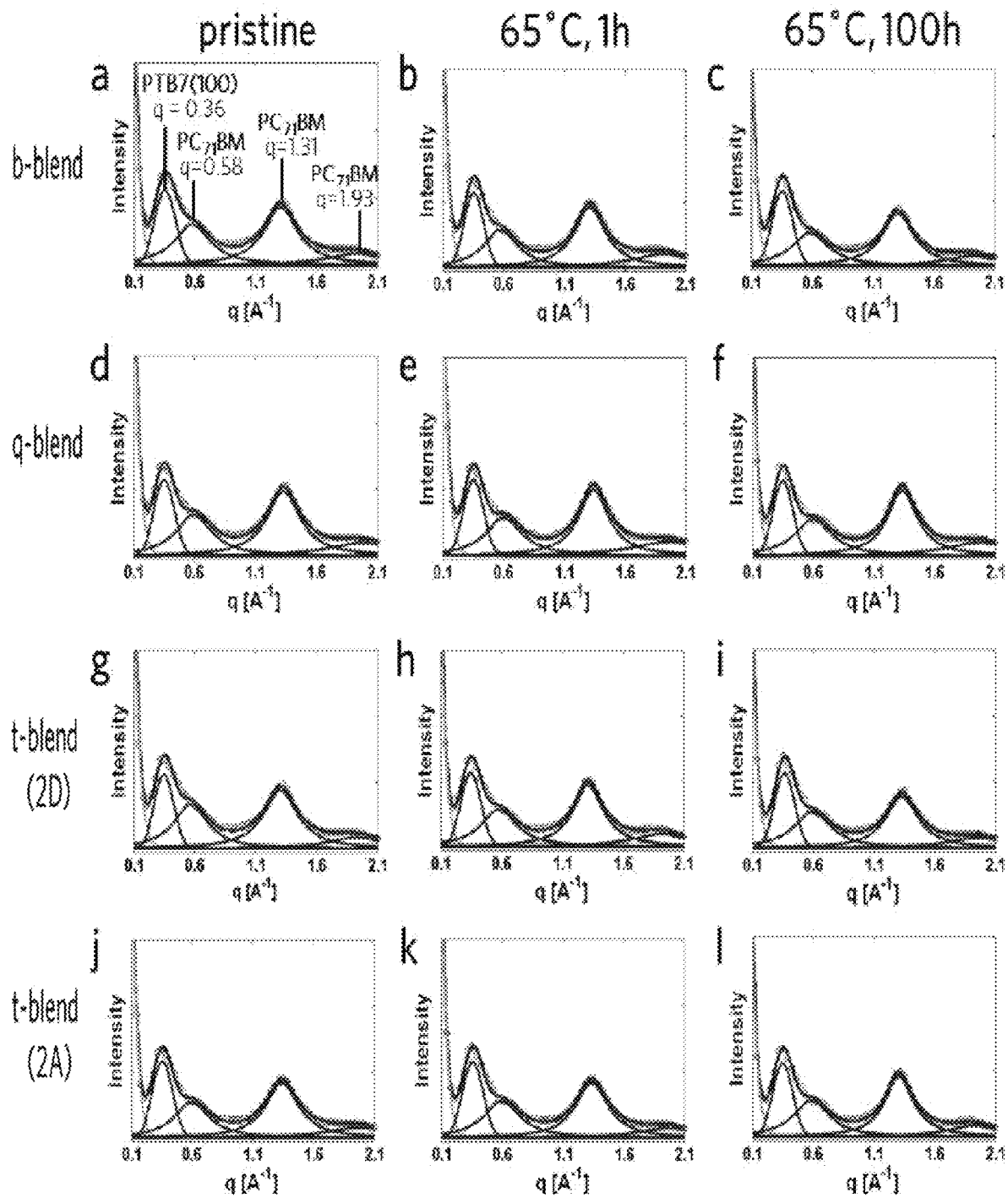

FIG. 4 shows UV-Vis-NIR absorption spectra of each of the active layer films made of pure PTB7, pure PCDTBT, the binary blend (PTB7:$PC_{71}BM$=1.0:1.5), the ternary blend (PTB7:PCDTBT:$PC_{71}BM$=0.9:0.1:1.5), and quaternary blend (PTB7:PCDTBT:$PC_{71}BM$:$PC_{61}BM$=0.9:0.1:1.2:0.3);

FIG. 5 shows photoluminescence (PL) spectra obtained for pure PCDTBT, pure PTB7, the binary blend (PTB7 and PCDTBT), and the ternary blend (PTB7, PCDTBT, and $PC_{71}BM$) in order to examine transport kinetic effects with the incorporation of PCDTBT into PTB7;

FIG. 6a shows the calculated spatial distributions of the squared optical E-field in the thin layers of the organic photovoltaic comprising the quaternary active layer for different incident wavelengths;

FIG. 6b is a graph showing optical absorption spectra of the respective layers in the organic photovoltaic;

FIG. 6c is a graph showing the spatial distribution of the exciton generation rate (G(x)) in the active BHJ layer with different incident wavelengths assuming an AM 1.5G irradiation condition;

FIG. 6d is a graph showing a total position-dependent exciton generation rate ($G_{ex}$);

FIG. 7 shows UV-Vis-NIR absorption spectra of active layers accounting for test results obtained for color tenability in the device by controlling PTB7/PCDTBT and $PC_{71}BM$/$PC_{61}BM$ ratios in the quaternary BHJ layers;

FIGS. 8a and 8b are shows J-V curves and external quantum efficiency (EQE) spectra, respectively, obtained with different solvents for the reference binary blend (PTB7:$PC_{71}BM$) in order to select the optimized composition for the active layer of the organic photovoltaic;

FIGS. 9a and 9b are graph showing photovoltaic parameters (open-circuit voltage ($V_{OC}$), short-circuit current density (Jsc), fill factor(FF), and power conversion efficiency (PCE)) as a function of PCDTBT concentrations (x, 0≤x≤1) in PTB7:PCDTBT:$PC_{71}BM$ (1-x:x:1.5) blends;

FIGS. 9c and 9d are graphs showing photovoltaic parameters (open-circuit voltage ($V_{OC}$), short-circuit current density (Jsc), fill factor(FF), and power conversion efficiency (PCE)) as a function of $PC_{61}BM$ concentrations (y, 0≤y≤1.5) in PTB7:PCDTBT:$PC_{71}BM$:$PC_{61}BM$ blends (0.9:0.1:1.5-y: y);

FIGS. 9e and 9f are graphs showing EQE spectra and $J_{ph}$-$V_{eff}$ characteristics of binary, ternary, and quaternary organic photovoltaics, respectively;

FIG. 10a is a graph showing hole mobility ($\mu_h$)/electron mobility ($\mu_e$) ratios for pristine binary, ternary, and quaternary devices;

FIGS. 10b to 10d are graphs showing the hole mobility ($\mu_h$)/electron mobility ($\mu_e$) ratio, hole mobility ($\mu_h$), and electron mobility at 65° C. for various points (up to 24 hours);

FIG. 11 shows graphs accounting for J-V characteristics of pristine binary active layer based on PCDTBT (a), pristine binary active layer based on PTB7 (b), pristine ternary active layer (c), and pristine quaternary active layer (d);

FIGS. 12a to 12d are graphs showing suppressive effects on initial photovoltaic performance (normalized $V_{OC}$, Jsc, FF, and PCE) loss in b-, t-, and q-OPVs FIGS. 13a and 13b are graphs showing the normalized parameter loss for b-OPV and q-OPV, respectively, as a function of time and temperature, respectively;

FIGS. 14a and 14b are IQE spectra of b- and q-OPVs, respectively, with thermal annealing durations varying at 65° C.;

FIGS. 14c to 14j are graphs showing normalized IQE vs. PCE characteristics of b- and q-OPVs at 65° C. as a function of incident wavelength and time;

FIG. 15a shows 2D GIWAXS patterns of binary and quaternary BHJ blends for different annealing durations at 65° C.;

FIGS. 15b and 15c are graphs showing nanocrystallite sizes as a function of thermal treatment time for b-, t- (2D & 1A or 1D & 2A), and q-blends according to PTB7 (100) and fullerene derivatives (200), respectively;

FIG. 16 shows out-of-plane 2D GIWAXS line profiles as a result of the fitting each of the GIWAXS profiles of the binary, ternary, and quaternary BHJ blends with varying thermal treatment times at 65° C. for 0 hour (a, d, g, and j), 1 hour (b, e, h, and k), and 100 hours (c, f, i and l);

FIGS. 17a and 17b are Raman spectra of pure PTB7 and pure $PC_{71}BM$, respectively;

FIGS. 17c and 17d are graphs show transitions in Raman spectra induced by applying thermal treatment for b- and q-blends, respectively;

FIGS. 17e and 17f are views indicating major atomic vibrations for the two modes of PTR7 and $PC_{71}BM$, respectively.

Figure 18:
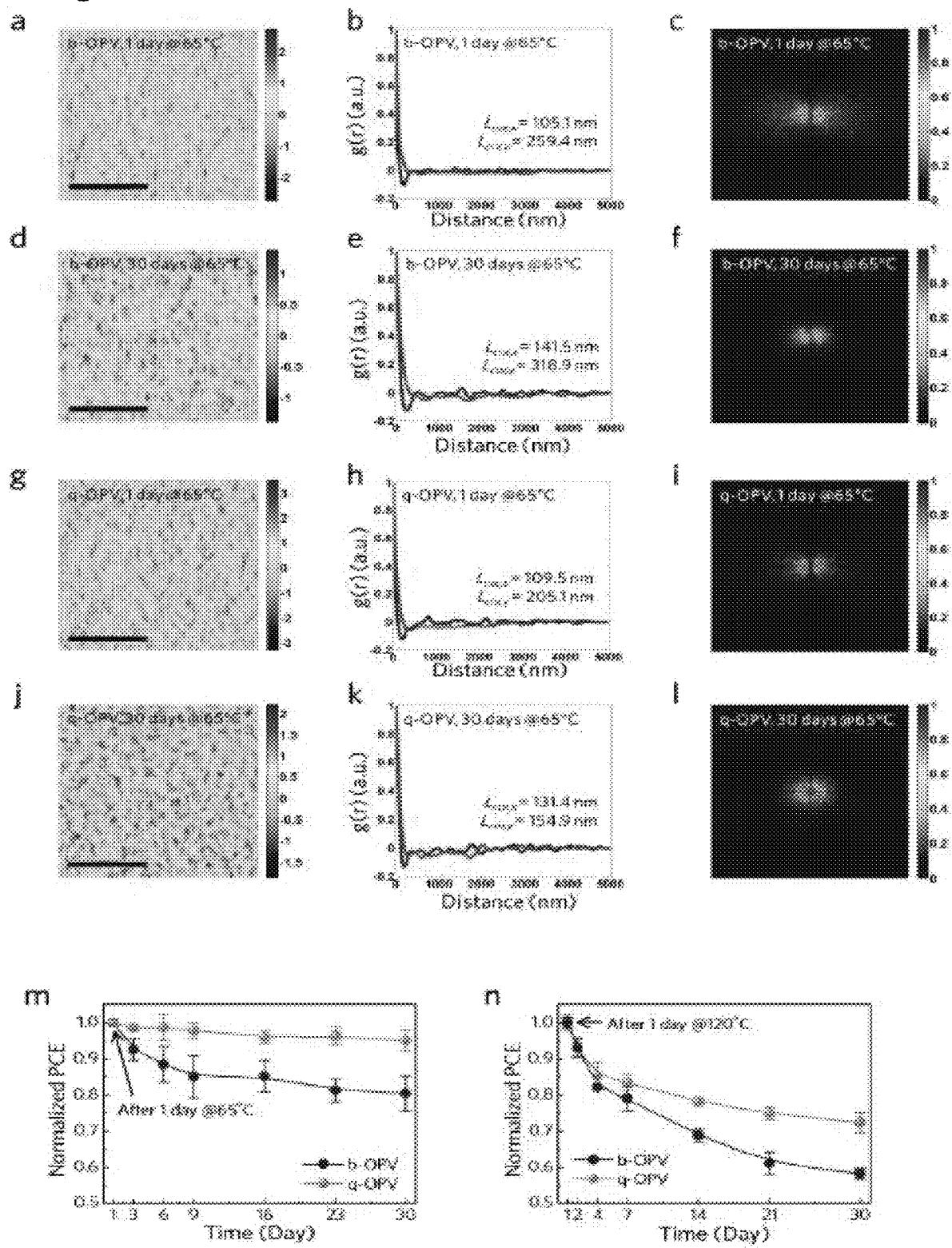
Figure 19:
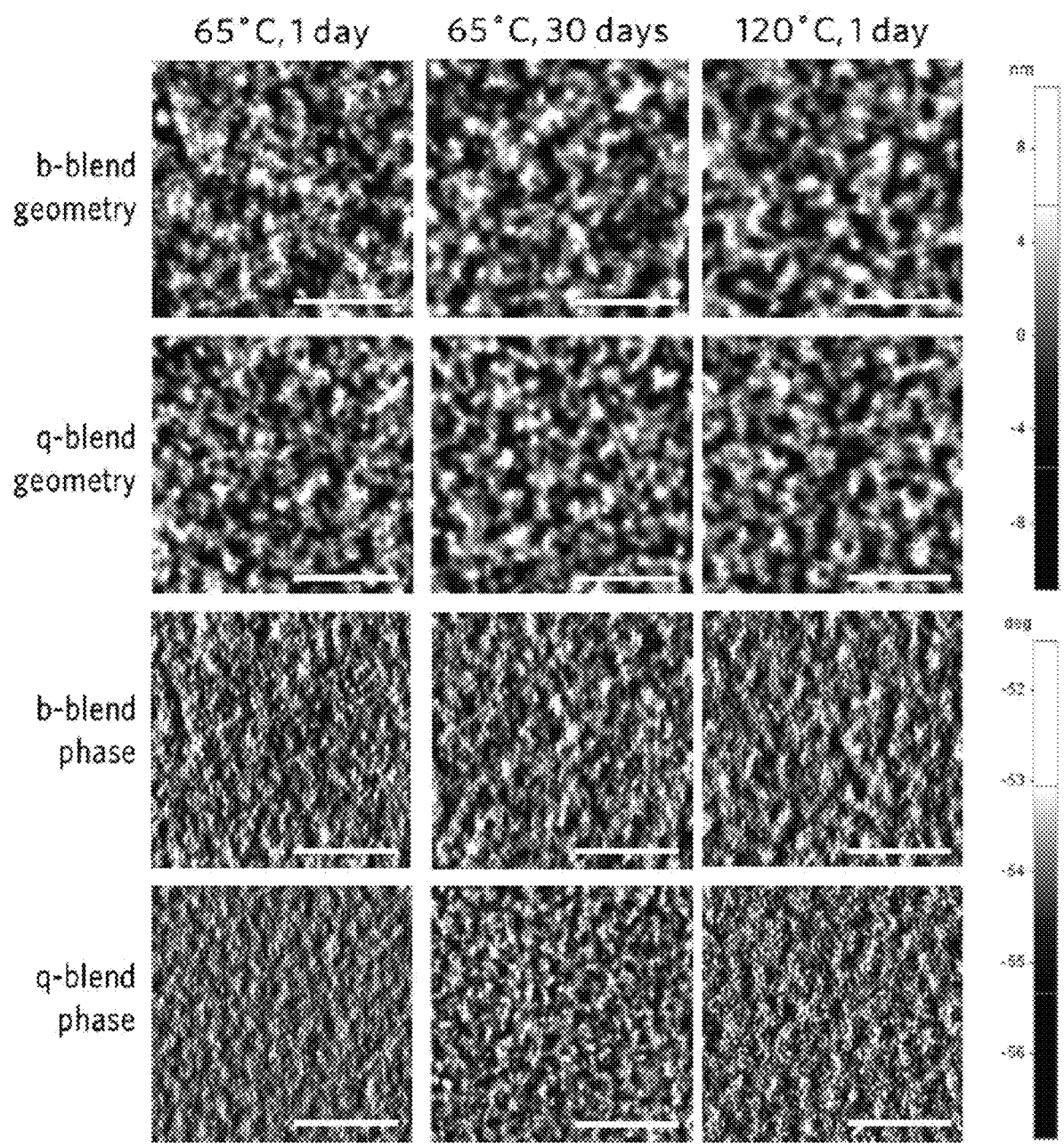
Figure 21:
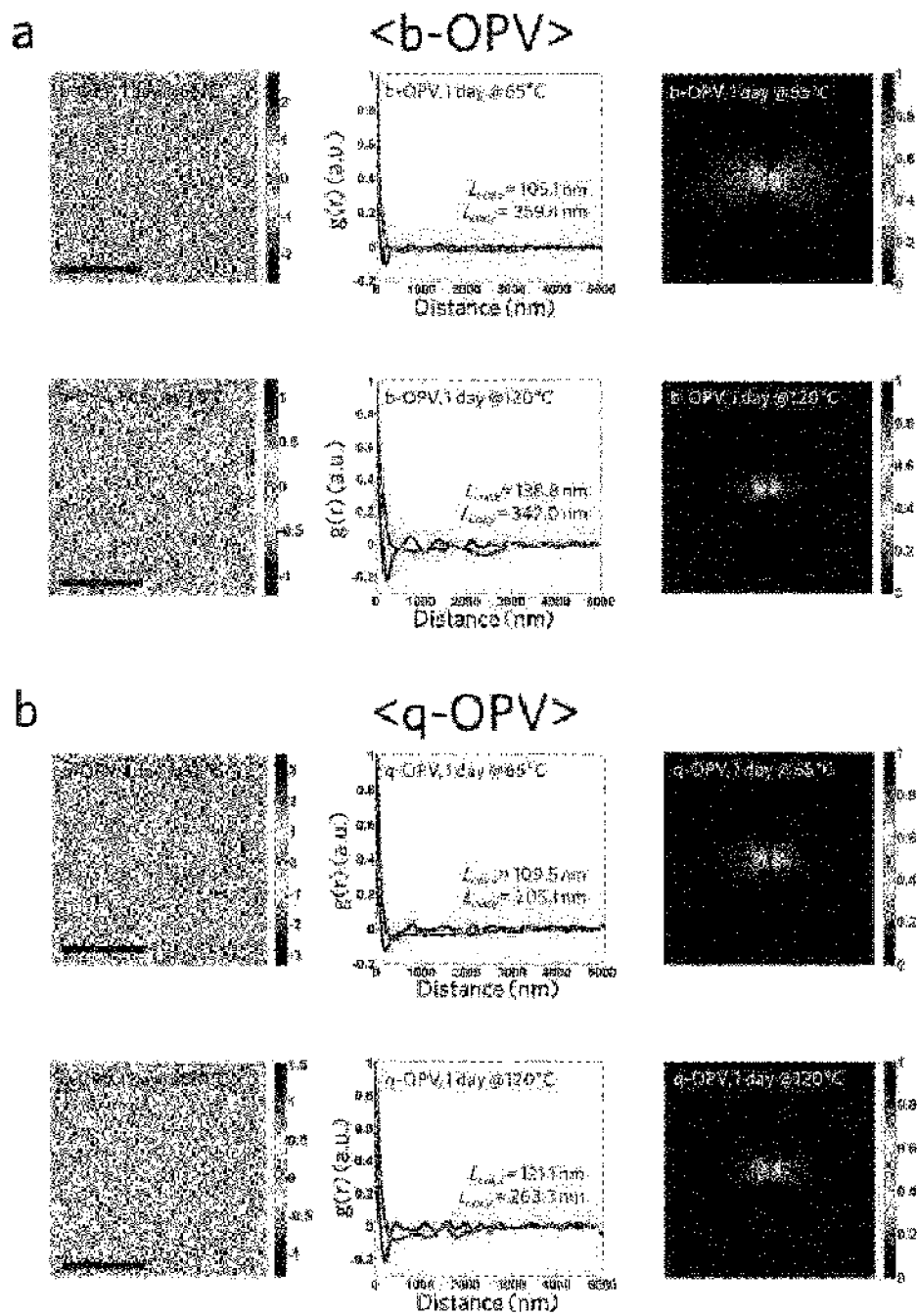
Figure 23:
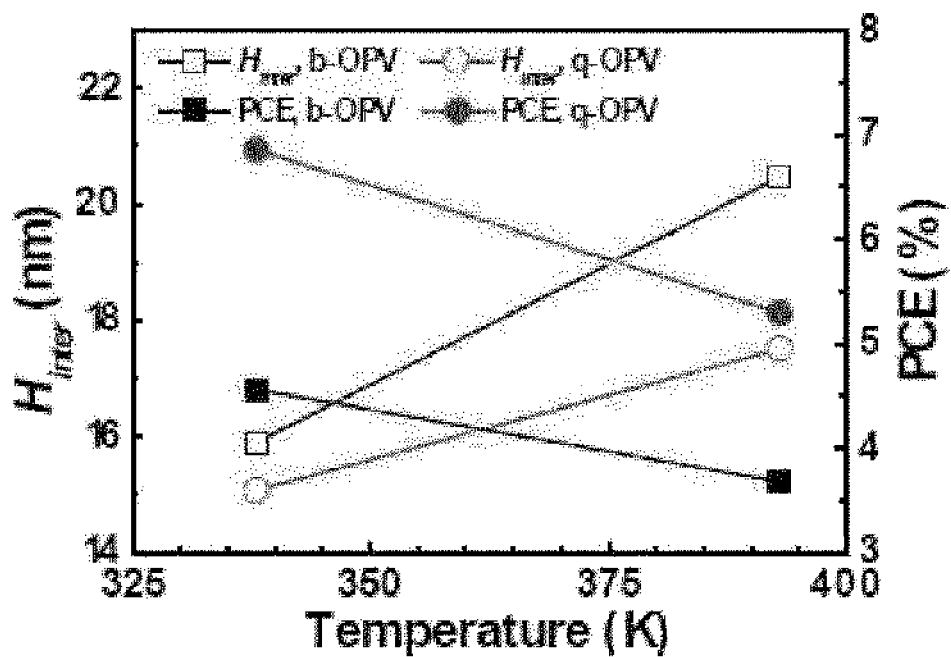
Figure 24:
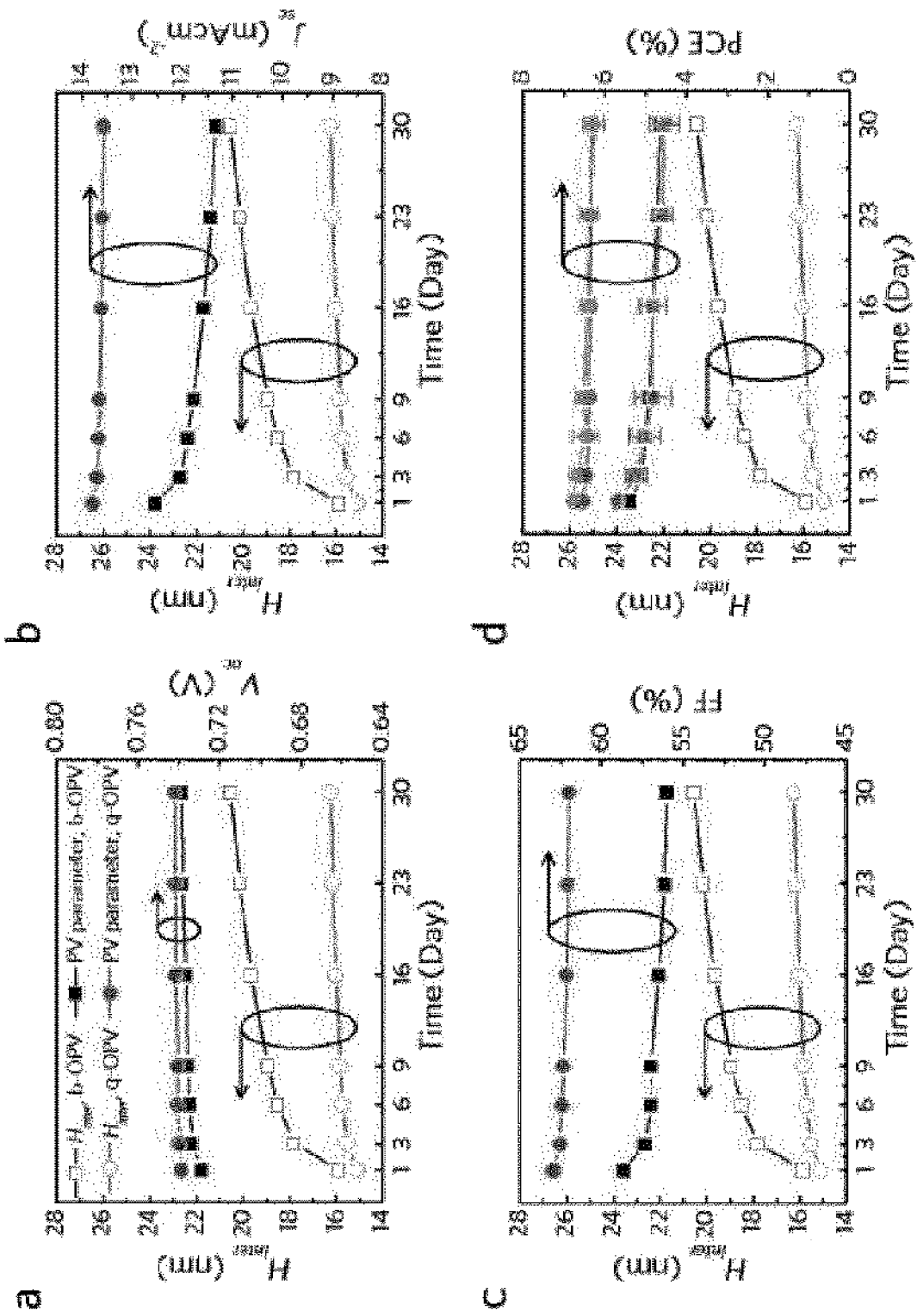

FIG. 18 shows results of a long-term stability test under thermal treatment for b- and q-OPVs;

FIG. 19 is a view showing tapping-mode 2D AFM geometry and phase images of the binary and quaternary blends as a function of annealing temperature and time, as analyzed by AFM;

FIGS. 20a to 20d show photovoltaic parameter (PCE, $V_{OC}$, Jsc, and FF) decay as a function of storage time at 65° C.;

FIG. 20e is respective J-V curves of b-OPV and q-OPV before and after thermal treatment at 65° C. for 30 days;

FIG. 21 shows a set of 2D AFM phase images, pair-correlation functions (g(r)), and 2D FFT (fast Fourier transform) profiles for the b- and q-OPVs with varying annealing temperatures (for example, 65° C. and 120° C.) for one day (the scan area is 5×5 μm² and the scale bars indicate 2 μm);

FIG. 22a shows graphs accounting for time-dependent PCE-$H_{inter}$ characteristics of b- and q-OPVs;

FIG. 22b is a graph showing long-term power conversion efficiency decay of b- and q-OPVs at 65° C.;

FIG. 23 is a graph showing results of the domain growth analysis with varying operating temperatures, with comparison of $H_{inter}$ and PCT of b- and q-OPVs as a function of annealing temperature for one day; and FIG. 24 shows graphs accounting for time-dependent $H_{inter}$ and $H_{inter}$-derived photovoltaic parameters ($V_{OC}$, Jsc, FF, and PCE) for b- and q-blends.

MODE FOR CARRYING OUT THE INVENTION

The present invention may be embodied by the following description. The following to description is to be understood as disclosing embodiments of the present invention, and the present invention is not necessarily limited thereto.

Furthermore, the appended drawings are used to understand embodiments of the present invention and are not construed as limiting the present invention, and details of individual constituents may be properly understood by specific purposes in the related description as will be described below The terms and terminologies used herein may be defined as follows.

Herein, the terms "donor" and "acceptor" are intended to mean material having a high ionization potential (donor) and a material having high electron affinity (acceptor), respectively. That is, a material to donate an electron comes into contact with a strongly electron accepting material to allow the dissociation of excitons into free charge carriers.

As used herein, the term "short-circuit current (Isc)" means a flowing current at a voltage of 0 between the opposite ends of the solar cell. Since the current is attributed to the generation and collection of charges created by light, a short-circuit current and a light-generated current photovoltaic are identical to each other for an ideal solar cell. As such, a short-circuit current accounts for a maximum current that can be achieved in a solar cell and is determined by the elements shown in the following Mathematical Formula 1:

$$\text{Isc} \propto \varepsilon_A * \varepsilon_{ED} * \varepsilon_{CT} * \varepsilon_{CC} \qquad \text{Mathematical Formula 1}$$

wherein, $\varepsilon_A$ represents light absorption efficiency, $\varepsilon_{ED}$ represents for exciton diffusion efficiency, $\varepsilon_{CT}$ represents charge transport efficiency, and $\varepsilon_{CC}$ represents charge collection efficiency.

The term "open-circuit voltage ($V_{OC}$)" refers to a voltage occurring across the opposite ends of a solar cell at zero current and corresponds to the maximum voltage available from the solar cell.

The term "fill factor (FF)" refers to the ratio of maximum obtainable power to the product of the open-circuit voltage and short-circuit current, as defined in the following Mathematical Equation 1, and corresponds to a maximum area rectangle that can be filled under the current-voltage curve.

$$FF = \frac{I_{max} V_{max}}{I_{SC} V_{OC}} \qquad \text{[Mathematical Equation 1]}$$

"power conversion efficiency" is the most important factor representing the performance of a solar cell and is the ratio of output energy to the input energy from the sun, as defined in the following Mathematical Equation 2:

$$\eta = \frac{P_{out}}{P_{in}} = \frac{I_{max} V_{max}}{P_{in}} = FF \frac{I_{SC} V_{OC}}{P_{in}} \qquad \text{[Mathematical Equation 2]}$$

As used herein, the term "bandgap" refers to a difference between HOMO and LUMO in a given organic component (polymer and/or low-molecular-weight).

It will be understood that when an element is referred to as being "on" another element, it can be directly on the other element or intervening elements may be present therebetween. In contrast, when an element is referred to as being "directly on" another element, there are no intervening elements present.

Similarly, the expressions "under", "beneath", "below" should also be understood as a relative concept for positions.

Figure 1:
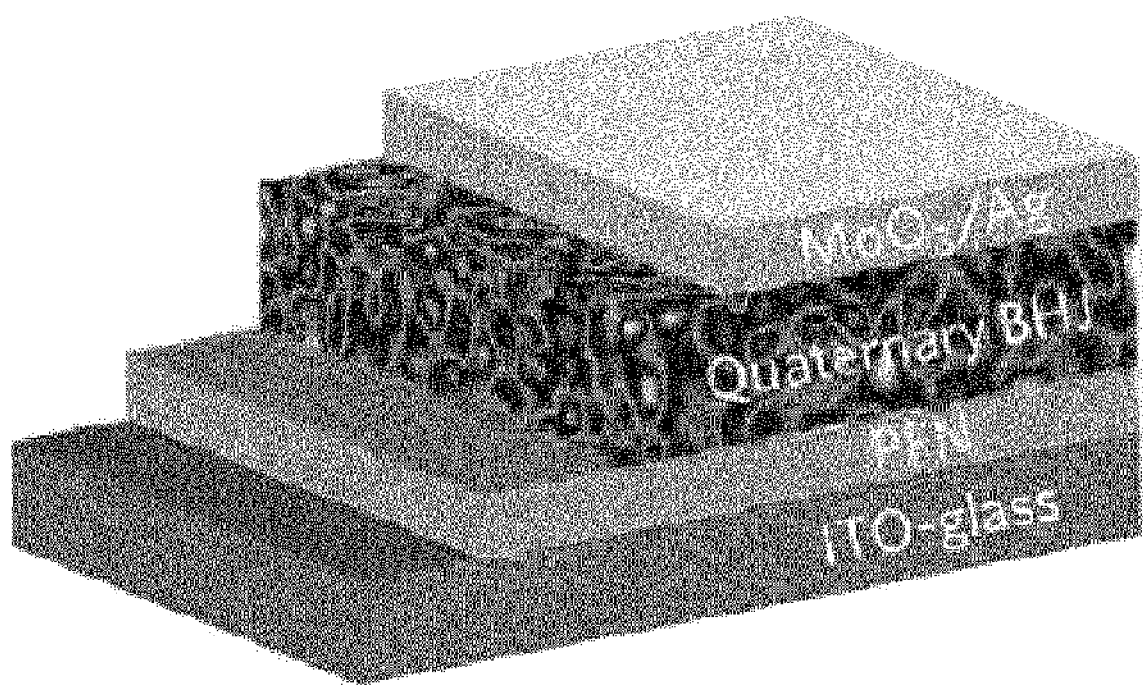
FIG. 1 is a schematic diagram depicting an illustrative basic structure of an organic photovoltaic to which an active layer according to the present disclosure is applicable.

FIG. 1 schematically depicts an example (inverted type) of the basic structure of a typical organic photovoltaic to which the active layer according to the present disclosure is applicable.

As a rule, an organic photovoltaic may be briefly represented as the basic structure of metal/active layer/metal. As shown, a structure in which a substrate, a lower electrode layer (cathode), an active layer, and an upper electrode layer (anode) are formed in the order from the bottom is provided.

Incidence of light on an organic photovoltaic creates a positive charge (hole) and a negative charge (electron) in the active layer, and the electron moves to the upper electrode layer disposed on the active layer while the hole is directed to the lower electrode layer under the active layer. In detail, when a donor component in the active layer absorbs a photon, an electron is transferred from HOMO to LUMO, creating an exciton in an excited state. According to an illustrative embodiment, the donor component is an organic material in a broad sense and may be particularly a polymer material.

Next, the dissociation of the created exciton into an electron and a hole is accompanied. The acceptor component in the active layer has LUMO lower than that of the donor component. When the exciton created in the donor component reaches an interface with the acceptor component during diffusion in arbitrary directions, the acceptor component attracts the electron to induce charge separation. In this regard, the hole remaining in the donor component migrates to the cathode while the electron existing in the acceptor component travels toward the anode.

In addition, the exciton has a high binding energy due to a low dielectric constant of the donor component. In order to overcome such binding energy, a LUMO energy level difference of at least about 0.3 eV, particularly at least about 0.5 eV should be required for inducing the charge dissociation of excitons.

To this end, there is a need for minimizing loss at the interfaces between the active layer and the electrodes, securing a path through which electrons and holes separated in the active layer can move to the electrodes without forming a short circuit, and making the mobility of charges (electrons and holes) smooth in each of the donor component and the acceptor component.

With reference to FIG. 1, the substrate may be one typically used in the art, preferably, a transparent substrate made of a transparent insulating material with excellent light transmittance, for example, a quartz substrate, a glass substrate (soda lime glass, general glass, reinforced glass, etc.), a transparent plastic substrate (a polymer materials such as polyethylene terephthalate, polyethylene sulfone, polycarbonate, polypropylene, polystyrene, etc.). Alternatively, a silicon substrate, a sapphire substrate, a metal substrate (for example, a metal plate, a metal foil, etc.), and the like may be employed. No particular limitations are imparted to the substrate thickness and a suitable dimension may be selected therefor in consideration of the substrate material.

In the embodiment depicted, the lower electrode layer is a cathode and may be made of a transparent material, for example, TCO (transparent conductive oxide). Examples of TCO include indium tin oxide, indium zinc oxide, gallium zinc oxide, aluminum zinc oxide, and a combination thereof. Typically, the lower electrode layer (for example, ITO) may be provided in the form of a coating on the substrate (for example, glass substrate).

Meanwhile, the upper electrode layer is an anode which may be made of Ni, Al, Ag, Au, Co, Pd, Cu, etc. alone or in combination. According to circumstances, the upper electrode layer may be a deposited film of the elements.

For the inverted-type organic photovoltaic depicted, the work function of the upper electrode layer (anode) should be high enough to match with the HOMO energy level of the donor component while the work function of the lower electrode layer (cathode) should be low enough to match with the LUMO energy level of the acceptor (that is, there is a difference in work function between the electrodes). For an upper electrode layer made of a metal having a high work function, such as Au or Ag, the use of TCO having a high work function (for example, about 4.7 eV in ITO) in a lower electrode may cause a mismatch with the LUMO level of the acceptor. In consideration of this event, the lower electrode layer may be modified with a thin film made of an electron conductive (hole blocking) material (for example, ZnO, TiOx, etc.) to ensure the matching.

According to an illustrative embodiment, the lower and the former electrode layer may be each formed using LPCVD (low pressure chemical vapor deposition), PECVD, ALD (atomic layer deposition), sputtering, electron-beam evaporation, thermal evaporation, etc., but the present disclosure is not limited thereto.

The thickness of the active layer may be selected within a suitable numerical scope in consideration of the donor component and kinds of the low-molecular-weight acceptor component used, light absorption amount, charge (hole and electron) mobility, etc. and may range, for example, from about 50 to 300 nm, particularly from about 70 to 200 nm, and more particularly from about 90 to 150 nm, but is not limited thereto. When the thickness of the active layer is below or exceeds particular levels, the light absorption area or the charge mobility is reduced, resulting in lowering the efficiency of the organic photovoltaic. Hence, it may be advantageous to select the thickness within the above-mentioned range.

In order to enhance the power conversion efficiency thereof, the solar cell may further comprise a charge transport layer such as a hole transport layer and/or an electron transport layer. For instance, a poly[(9,9-bis(3'-(N,N-dimethylamino)propyl)-2,7-fluorene)-alt-2,7-(9,9-dioctylfluorene)] (PFN) layer having the repeating unit represented by the following General Formula 1 may be formed to modify the surface of the cathode (e.g., ITO):

[General Formula 1]

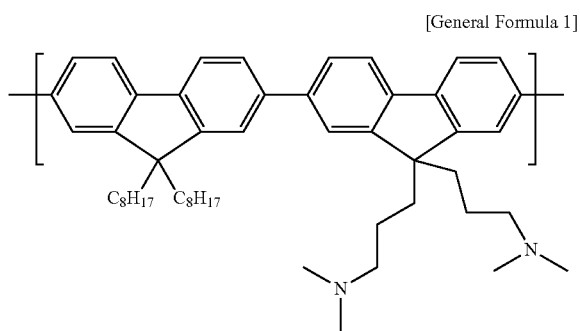

PFN is a conjugated polymer dissolvable in a solvent such as methanol and can provide the effect of improving the power conversion efficiency by increasing charge transport potential and reducing recombination between holes and electrons.

In this regard, the additionally formed layer may range in thickness from about 5 to 20 nm, particularly from about 7 to 15 nm, and more particularly from 9 to 12 nm.

According to an illustrative embodiment, a hole transport layer, for example, a MoO$_3$ layer may be introduced on the anode (for example, Ag layer) and may have a thickness of about 1 to 10 nm and particularly about 2 to 7 nm. The numeral ranges supposed above are illustrative, but do not limit the present disclosure.

According to an embodiment, the composition for forming an active layer comprises: a donor component creating an exciton in response to light absorption and donating an electron dissociated from the created exciton; and a low-molecular-weight fullerene acceptor composition accepting the electron donated from the donor component. In greater detail, the composition for forming an active layer is an at least quaternary composition (or blend) which comprises, in consideration of absorption profiles and cascade energy levels, at least two donor components (first donor and second donor); and at least two low-molecular-weight fullerene components (first and second low-molecular-weight acceptor) as acceptor components.

It is a noticeable feature of the embodiment that an exceptional improvement can be brought about into the lifespan characteristic as well as the photovoltaic performance (or parameter) in the solar cell, compared to conventional binary or ternary active layers, by employing two donor components (D) and two low-molecular-weight fullerene components (A). As such, a combination of at least two donor components and at least two low-molecular-weight fullerene acceptor components can effectively alleviate the phenomenon of degrading the stability of the device, such as the phase separation of the blend, upon long-term operation.

Without being bound by any theory, a blend for the active layer is thermodynamically unstable at high temperatures such that the domains of the donor component and the low-molecular-weight fullerene acceptor grow during the operation of the organic photovoltaic, thus causing degradation. In particular, at outdoor operating temperatures, which often exceed the glass transition temperature of typical polymers, both non-crystalline polymers and fullerene derivatives are readily clustered accompanying reduction in the donor (D)-acceptor (A) interfacial areas and increase in the percolation threshold for charge carrier transport.

In contrast to typical binary or ternary compositions, the additionally added donor component and/or low-molecular-weight fullerene acceptor component acts as a morphology stabilizer to provide parameters to control blending and separation behaviors of the components, thereby arresting the morphology at its optimum. For example, the incorporation of an additional low-molecular-weight fullerene acceptor component restricts the diffusion of other low-molecular-weight fullerene acceptor components, thus controlling domain growth in the BHJs, with no requirement of additional chemical modification or post-treatment.

As such, employment of two or more kinds of each of the donor component and the low-molecular-weight acceptor, which are different in energy level, results in broadening the absorption spectrum, providing superb light absorptivity and high exciton dissociation rate, and facilitating transport kinetics as well as retaining optimized morphology. Hence, the active layer with the components exhibits improved photovoltaic performance (efficiency) and is highly stable even during operation at high temperatures for a long period of time, which would be advantageous for prolong the lifespan.

In one embodiment, the donor component (I) and the low-molecular-weight fullerene acceptor component (II) may be used at a mass ratio of about 1:1 to about 1:3, particularly about 1:1 to about 1:2, and more particularly about 1:1 to about 1:1.5. The reason why a mass ratio between component (I) and component (II) is controlled into a particular range is to increase the efficiency of the solar cell and maintain thermal stability thanks to the minimization of morphological alteration. It would be advantageous to select within the above-mentioned range.

Of the at least quaternary active layer composition, the donor component (I) may comprise the first donor component at a content of about 1 to 99% by mass, particularly about 30 to 95% by mass, and more particularly about 40 to 80% by mass. When the content of the first donor component in the entire donor component (I) is below or exceeds particular levels, there may occur the problem that the solar cell degrades in efficiency. Therefore, it is preferred that the content be adjusted within the above-mentioned range.

According to one embodiment, the at least quaternary active layer composition is based on a binary composition of a basic donor component (hereinafter referred to as "first donor component") and a basic low-molecular-weight fullerene acceptor component (hereinafter referred to as "first low-molecular-weight acceptor component") plus at least on donor component (hereinafter referred to as "second donor component") and at least one low-molecular-weight acceptor component (hereinafter referred to as "second low-molecular-weight acceptor component").

In one embodiment, the first donor component may be a polymer material and may be typically a material having a bandgap of about 1.1 to 2.5 eV and more typically about 1.2 to 2.3 eV. According to an illustrative embodiment, the material meeting the bandgap requirement may be poly[[4,8-bis[(2-ethylhexyl)oxy]benzo[1,2-b:4,5-b']dithiophene-2,6-diyl][3-fluoro-2-[(2 ethylhexyl)carbonyl]thieno[3,4-b]thiophenediyl]] (PTB7) having the repeating unit represented by the following General Formula 2:

[General Formula 2]

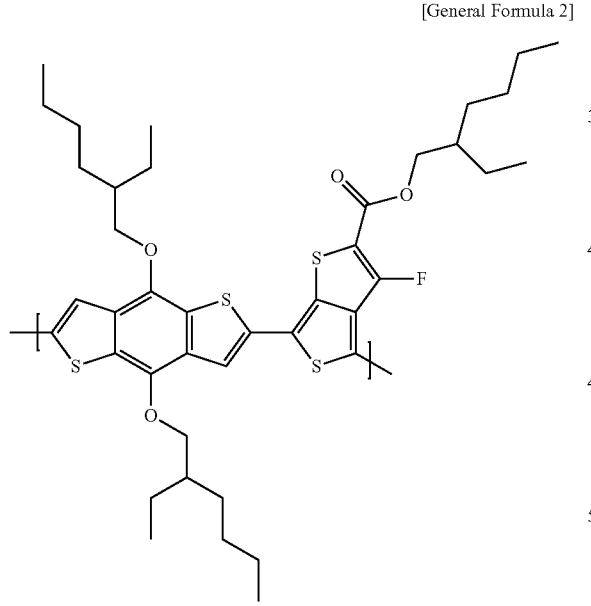

PTB7 has an optical bandgap of about 1.65 eV. In addition to PTB7, examples of materials (particularly polymers) available as the first donor component are listed in Table 1, below.

TABLE 1

| Polymer | Bandgap (eV) |
|---------|--------------|
| BTT-DPP | 1.33 |
| DPP-TT-T | 1.38 |
| PCPDTBT | 1.43 |

In this context, BTT-DPP, DPP-TT-T, and PCPDTBT may each have the repeating units represented by the following General Formulas 3 to 5, respectively:

[General Formula 3]

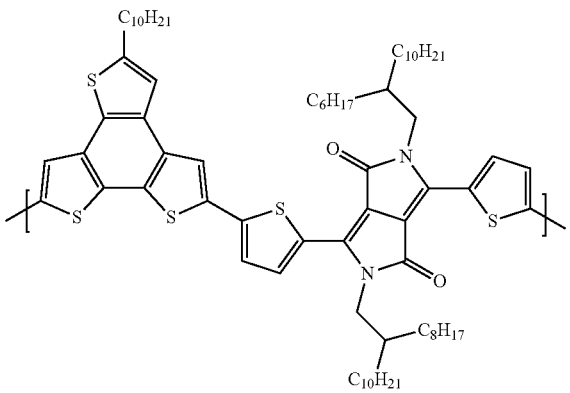

[General Formula 4]

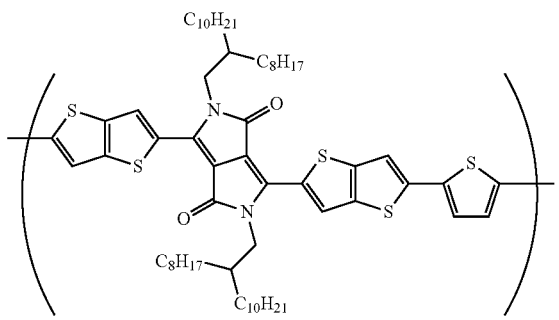

[General Formula 5]

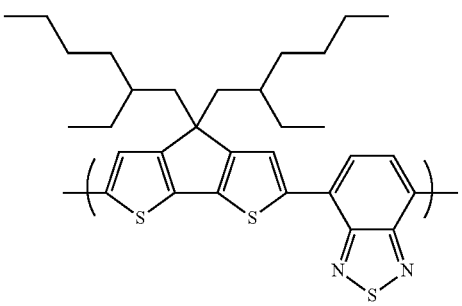

As the first donor component, materials satisfying the above-mentioned requirements may be used alone or in combination. As such, a material having a particular bandgap, when used as the first donor component, can absorb a large number of photons, thus potentially allowing higher power conversion efficiency.

In an illustrative embodiment, a polymer for use as the first donor component may have a molecular weight (Mw) of about 10,000 to 500,000, particularly about 15,000 to 400,000, and more particularly about 20,000 to 350,000 and may be appropriately selected in general consideration of kinds of polymers, desired energy levels or bandgaps, desired crystal properties in the active layer, etc.

Meanwhile, the second donor component may have, for example, cascade energy levels with respect to the first donor component and may be thus a material having LUMO identical to or lower than that of the first donor component. By way of example, the LUMO of the second donor component may be reduced to up to about 50%, particularly about 20 to 45%, and more particularly about 30 to 35% of the LUMO of the first donor component.

Given to the second donor component with respect to the first donor component, the above-mentioned energy level can advantageously allow the smooth energy flow between the donor components.

In an illustrative embodiment, the second donor component may be the polymer poly[N-9'-heptadecanyl-2,7-carbazole-alt-5,5-(4',7'-di-2-thienyl-2',1',3'-benzothiadiazole)] (PCDTBT) having the repeating unit represented by the following General Formula 6:

[General Formula 6]

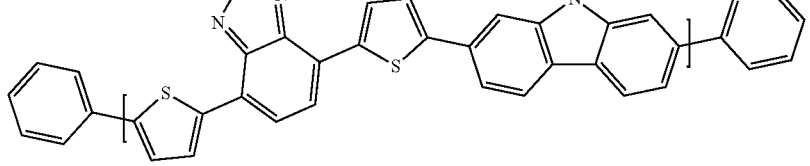

In addition, examples of the polymers available as the second donor component include PCDTBT, F8TBT, PPV, MDMO-PPV, MEH-PPV, P3HT, PBDTTT-CF, F8BT, PSBTBT, PBTTPD, and TQ1, which may be used alone or in combination. In this context, MDMO-PPV, MEH-PPV, and P3HT have the repeating units represented by the following General Formulas 7 to 9:

[General Formula 7]

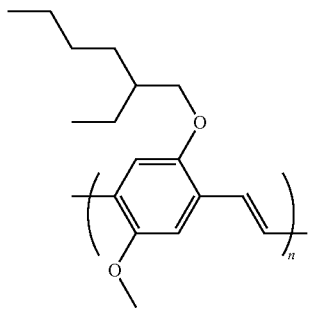

[General Formula 8]

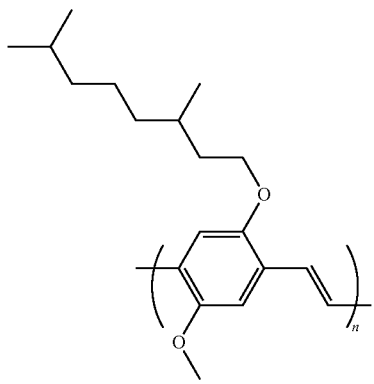

[General Formula 9]

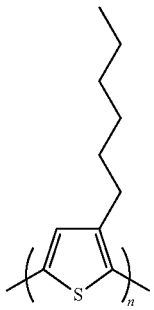

In this regard, the second donor component may typically range in bandgap from about 1.2 to 2.6 eV and more typically from about 1.4 to 2.5 eV. For example, PCDTBT, MEH-PPV, and P3HT have respective optical bandgaps of about 1.86 eV, about 2.11 eV, and about 1.95 eV.

In an illustrative embodiment, a polymer for use as the second donor component may have a molecular weight (Mw) of about 10,000 to 500,000, particularly about 15,000 to 400,000, and more particularly about 20,000 to 350,000 and may be appropriately selected in general consideration of kinds of polymers, desired energy levels or bandgaps, desired morphological properties in the active layer, etc. In one illustrative embodiment, the LUMO of the second donor component may be higher than that of the first low-molecular-weight fullerene acceptor component, for example, by at least about 0.3 eV and particularly by about 0.31 to 0.35 eV.

In one embodiment, the first low-molecular-weight fullerene acceptor component may have a cascade energy level structure with respect to the donor component (particularly, the second donor component). In this context, the HOMO of the second donor component may be in an energy level identical to or higher than that of the first low-molecular-weight fullerene acceptor component. By way of example, the HOMO of the second donor component may be higher than that of the first low-molecular-weight fullerene acceptor component by at least about 0.3 eV and particularly by about 0.31 to 0.35 eV. Given to the second donor component with respect to the first low-molecular-weight fullerene acceptor component, the energy level can advantageously allow the smooth energy flow therebetween.

In an illustrative embodiment, the first low-molecular-weight fullerene acceptor component may be [6,6]-phenyl C71butyricacidmethylester(PC$_{71}$BM) represented by the following General Formula 10, C60, C70, C84, PC$_{61}$BM, ICBA, ICMA, or [6,6]-Thienyl C61 butyric acid methyl ester, which may be used alone or in combination:

[General Formula 10]

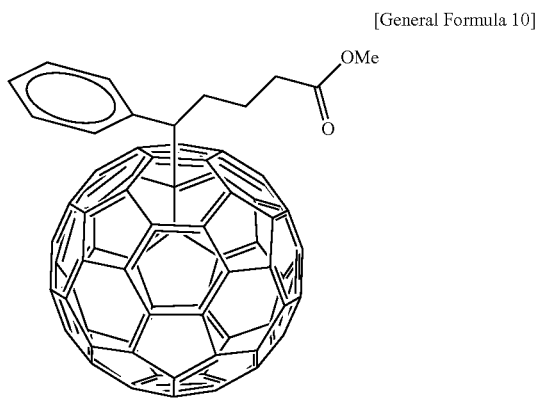

[General Formula 11]

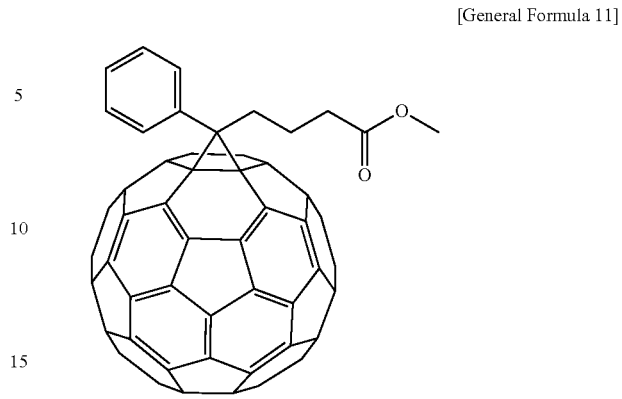

In one embodiment, the first low-molecular-weight fullerene acceptor component may typically range in optical bandgap from about 1.5 to 2.5 eV and more typically from about 1.7 to 2.3. eV. For instance, PC$_{71}$BM has an optical bandgap of about 1.96 eV.

According to one embodiment, the second low-molecular-weight fullerene acceptor component forms a cascade energy level structure with respect to the first low-molecular-weight fullerene acceptor component and may have a LUMO higher than the HOMO of the first low-molecular-weight fullerene acceptor component. In addition, the second low-molecular-weight fullerene acceptor component may have a LUMO lower than that of the first donor component.

According to an illustrative embodiment, the LUMO of the second low-molecular-weight fullerene acceptor component may be higher by about up to 50% (particularly about 20 to 45% and more particularly about 30 to 35%) than the HOMO of the first low-molecular-weight fullerene acceptor component and may be lower by about 0.3 eV and particularly by about 0.31 to 0.35 eV than the LUMO of the first donor component.

In the low-molecular-weight acceptor component (II), the first low-molecular-weight fullerene acceptor component may be present at a content of about 1 to 99% by mass, particularly about 20 to 90% by mass, and more particularly about 40 to 80% by mass. When the content of the first low-molecular-weight fullerene acceptor component is below or exceeds certain levels, the lifespan of the solar cell may degrade due to the morphological alteration. Therefore, it would be advantageous that the content be adjusted within the above-mentioned range.

In an illustrative embodiment, concrete examples of the second low-molecular-weight fullerene acceptor component include [6,6]-phenyl C61butyricacidmethylester(PC$_{61}$BM) represented by the following General Formula 11, C60, C70, C84, ICBA, ICMA, [6,6]-Thienyl C61 butyric acid and methyl ester, which may be used alone or in combination:

The second low-molecular-weight fullerene acceptor component may typically range in optical bandgap from about 1.5 to 2.5 eV and more typically from about 1.7 to 2.3. eV. For example, the optical bandgap of PC$_{61}$BM is about 2.1 eV.

In an illustrative embodiment, the HOMO of the second low-molecular-weight fullerene acceptor component may be lower than the LUMO of the first low-molecular-weight fullerene acceptor component. By way of example, the HOMO of the second low-molecular-weight fullerene acceptor component may be lower by about up to about 50% (particularly about 20 to 45% and more particularly about 30 to 35%) than the LUMO of the first low-molecular-weight fullerene acceptor component.

When the quaternary composition is introduced into the active layer in a typical organic photovoltaic, particularly with the use of a polymer material as a donor component, any coating method, such as spin coating, dip coating, bar coating, inkjet printing, etc. may be applied without particular limitations thereto.

For the coating, the above-mentioned at least four components may be dissolved in an organic solvent. As the organic solvent, for example, chlorobenzene, chloroform, para-xylene, dichlorobenzene, trichlorobenzene, hexane, and THF may be used alone or in combination. Of the solvents exemplified above, chlorobenzene may be advantageous because of the attainment of higher photovoltaic efficiency (in detail, EQE). The organic solvent may be used in an amount of about 1 to 4% by mass, based on the total mass of the quaternary donor and acceptor components, particularly in an amount of about 1.2 to 3.5% by mass, and more particularly in an amount of about 1.5 to 3% by mass. However, the amount ranges are illustrative, and various amounts of the solvent may be used unless any problem with the coating is present.

According to an illustrative embodiment, the composition may further comprise diiodooctane (e.g., 1,8-diiodooctane), diiodohexane (e.g., 1,6-diiodohexane), octanethiol (e.g., 1,8-octanedithiol), dibromooctane (e.g., 1,8-dibromooctane), 1-chloronaphthalene), 1-methylnaphthalene, and a combination thereof as an additive to induce the formation of an optimum continuous morphology. In this regard, the amount of the available additive component may range from about 1 to 7% by mass, particularly about 1.5 to 6% by mass, and more particularly about 2 to 5% by mass.

The at least quaternary active layer composition provided according to the embodiment exhibits balanced charge carrier mobilities and, for example, the pristine composition may have an hole mobility ($\mu_h$)/electron mobility ($\mu_e$) ratio of about 0.8 to 2, particularly about 0.9 to 1.8, more particularly about 0.95 to 1.5, far more particularly about 1 to 1.4.

In an illustrative embodiment, the organic photovoltaics fabricated using as an active layer a composition of at least four components (the first and the second donor components and the first and the second low-molecular-weight fullerene acceptor components) grouped to have particular energy level properties as mentioned above (for example, optical bandgaps) may retain a power conversion efficiency of at least about 6.2% (in detail, at least about 6.25%, and more particularly at least 6.27%) after one month of operation at 65° C. or higher and at least about 6% (in detail, about 6.1%, and more particularly at least about 6.2%) after one year of operation at 65° C. or higher.

Moreover, the point at which the power conversion efficiency (PCE) has fallen (dropped) to 60% of the pristine (initial) value may be at least one year of operation, particularly at least 1.5 years, and more particularly about 2 years. The solar cell can retain at least about 70%, particularly at least about 72%, and more particularly at least about 75% of the pristine PCE. As described, the at least quaternary active layer composition can bring about an improvement in long-term stability at high temperatures. In contrast, when a binary composition is used, the power conversion efficiency decreases to a level of down to about 3.4%.

Without being bound by any theory, it is supposed that such improvements in the stability might be achieved by restricting the growth of the domains to suppress phase separation between the polymer and the low-molecular-weight fullerene. In a particularly illustrative embodiment, after an organic photovoltaic fabricated using the composition for the active layer is thermally treated at 65° C. or higher for 100 hours, the first donor component (particularly a polymer material) and the low-molecular-weight fullerene acceptor component may range in nanocrystallite size from about 34 to 40 Å (particularly about 35 to 39 Å, and more particularly about 36 to 38 Å) and from about 18 to 21 Å (particularly about 18.5 to 20.5 Å, and more particularly about 19 to 20 Å), respectively.

Furthermore, the organic photovoltaic can attain good resistance to power conversion efficiency loss even after operation in more severe conditions, for example, at about 120° C.

As described in the foregoing, the BHJ platform comprising the active layer according to the present disclosure can provide a new approach to the maintenance of high efficiency over a long period of time and can be applied to outdoor organic photovoltaics without any problems.

Hereinafter, the present disclosure will be described in detail with reference to examples. These examples are only for illustrating the present invention more specifically, and it will be apparent to those skilled in the art that the scope of the present invention is not limited by these examples.

Examples

Fabrication of Organic Photovoltaic

PCDTBT (molecular weight (Mw): 57,000, 1-Material), PTB7 (Mw: of 115,000, 1-Material), $PC_{71}BM$ (>99%, Nano-C), and $PC_{61}BM$ (>99.5%, Nano-C) were used as received. The device fabrication was based on the protocol optimized for the PTB7-based binary organic photovoltaic. First, each of various amounts (x mg, 0<x<10 mg) of PCDTBT was dissolved in 970 µL of chlorobenzene (anhydrous, 99.8%, Sigma-Aldrich) and magnetically stirred at 80° C. for 72 hours. PTB7 (10-x mg), $PC_{61}BM$ (y mg, 0<y<15 mg), $PC_{71}BM$ (15-y mg) and 30 µL of 1,8-diiodooctane (DIO, 98%, Sigma-Aldrich) were mixed with the fully blended PCDTBT solution, followed by magnetic stirring at 50° C. for 24 hours.

A solution of 0.5 mg/ml PFN (1-Material) and 2 µL/mL acetic acid in methanol was applied onto ITO-coated glass and dried for 1 hour at room temperature. The binary blend (b-BHJ blend), the ternary blend (t-BHJ blend), and the quaternary blend (q-BHJ blend) were each applied onto the top of the PFN layer by spin coating to form an active layer with a fixed thickness of 90±5 nm. The solvent was dried overnight in a vacuum chamber before top electrode deposition. An 8-nm-thick layer of $MoO_3$ and a 100-nm-thick layer of Ag were then thermally evaporated through a shadow mask.

The active area of the devices (0.116 $cm^2$) was defined by the overlap between the top and bottom electrodes. The complete organic photovoltaics were sealed in a nitrogen-filled glove box using an encapsulation glass immediately after the top electrode deposition.

Figure 2:
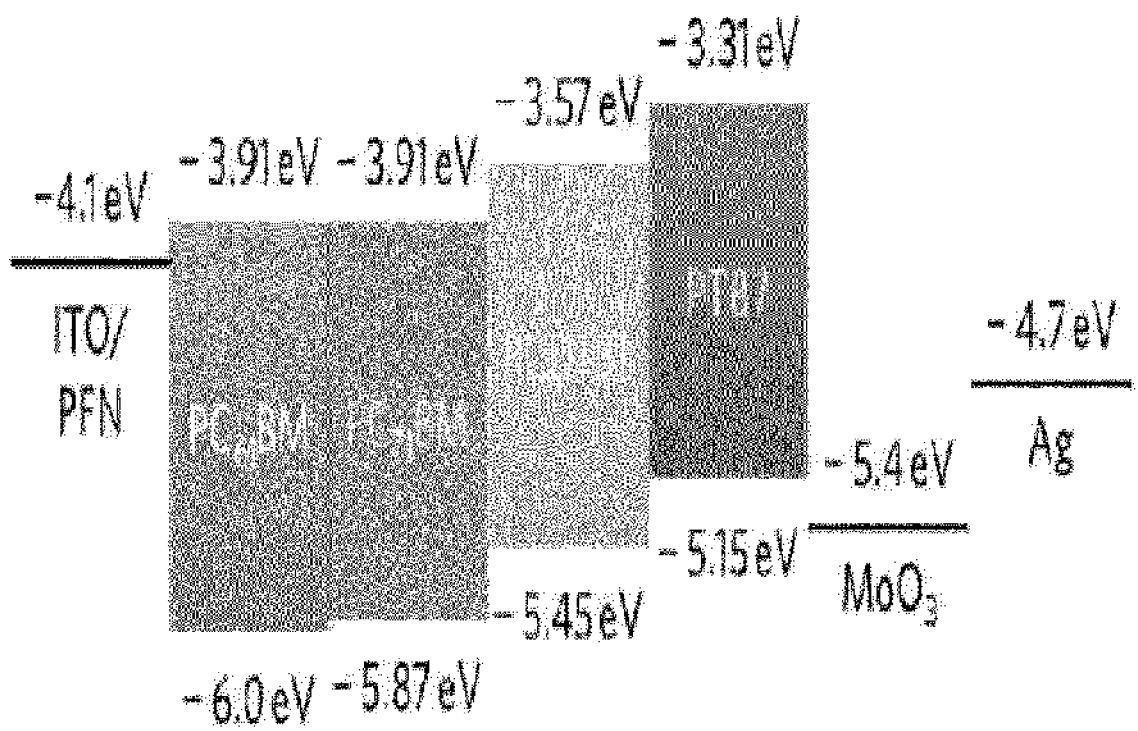
FIG. 2 is a view depicting the cascade energy levels of inverted-type organic photovoltaic fabricated using the quaternary blend (inclusive of PTB7, PCDTBT, $PC_{71}BM$, and $PC_{61}BM$) for forming an active layer according to an illustrative embodiment.

The internal energy levels of the inverted-type organic photovoltaic fabricated using the quaternary blend among the prepared active layer compositions are depicted in FIG. 2. As shown, the two donor components and the two low-molecular-weight fullerene acceptor components have cascade energy levels.

Figure 3:
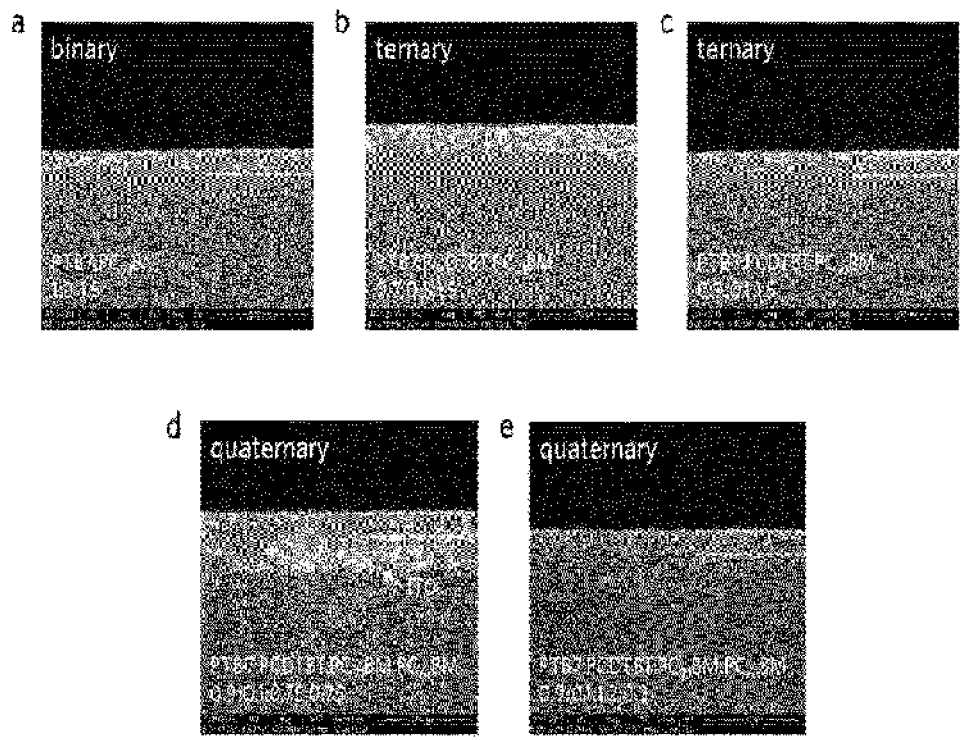
FIG. 3 shows scanning electron micrograph (SEM) images of the active layers having the fixed thickness (90±5 nm) for the binary blend (a), the two ternary blends different in composition ratio from each other (b and c), and the two quaternary blends different in composition ratio from each other (d and e)

Evaluation of Film Using Active Layer Composition Inclusive of Donor and Acceptor FIG. 3 shows scanning electron micrograph (SEM) images of the active layers having the fixed thickness (90±5 nm) for the binary blend (a), the two ternary blends different in composition ratio from each other (b and c), and the two quaternary blends different in composition ratio from each other (d and e), which were all formed according to the foregoing procedure. As can be seen, the quaternary blends could be formed into a film-type layer effectively on the electrode through a relatively simple process, like the blends of simpler compositions.

FIG. 4 shows UV-Vis-NIR absorption spectra of each of the active layer films made of pure PTB7, pure PCDTBT, the binary blend (PTB7:$PC_{71}BM$=1.0:1.5), the ternary blend (PTB7:PCDTBT:$PC_{71}BM$=0.9:0.1:1.5), and quaternary blend (PTB7:PCDTBT:$PC_{71}BM$:$PC_{61}BM$=0.9:0.1:1.2:0.3).

As shown in FIG. 4, the incorporation of PCDTBT in the binary blend (PTB7:$PC_{71}BM$) substantially increased the overall spectral response of the active layer toward a broad range of the ultraviolet-visible spectrum.

Photoluminescence (PL) Spectrum Analysis

An experiment was conducted in order to examine effects of the incorporation of PCDTBT into PTB7 on light emission properties. The resulting emission spectra are depicted in FIG. 5. PL intensity spectra of pure PCDTBT, pure PTB7, and the binary PTB7:PCDTBT blend (the excitation wavelength of 533 nm corresponds to the main absorption region of PCDTBT) are compared together in the figure.

As shown in the figure, when PCDTBT was mixed with PTB7 at a composition ratio of at PTB7:PCDTBT=0.5:0.5, the emission intensity from PCDTBT (centered at 705 nm) decreased while the PTB7 emission (centered at 770 nm) increased. This PL emission change strongly indicates the effective energy transfer from PCDTBT to PTB7. On the other hand, when the low-molecular-weight fullerene acceptor component was mixed in the PTB7:PCDTBT blend (e.g., PTB7:PCDTBT:$PC_{71}BM$=0.5:0.5:1.5), the PL emission peaks from both PCDTBT and PTB7 were distinctively quenched.

With reference to FIG. 2, this effect can be derived as a result of promoting cascade-type charge transport between the polymer components and the low-molecular-weight fullerenes. Hence, the operation of the q-OPV is observed to rely on both energy and charge transfer among the donor components and the acceptor components in the BHJ. In particular, the combination of the two donor components is kinetically advantageous for energy transfer (from PCDTBT to PTB7). Therefore, the incorporation of PCDTBT as a medium contributes to the generation of excitons and the hole relay process to promote hole extraction under the cascade-energy-level formation.

Moreover, the optical response was even further enhanced in the ultraviolet range (<380 nm) when the second acceptor $PC_{61}BM$ was added. This optical response implied that the quaternary organic photovoltaic is better at harnessing broadband solar energy (UV-Vis-near-infrared (NIR)) than the binary and ternary blends.

Optical Simulation Test

To investigate the optical response of the organic photovoltaics to the solar spectrum, an optical simulation was made on the basis of the T-matrix method, followed by calculating the internal optical E-field distribution in the organic photovoltaics having multilayer structures. A test was conducted to examine whether the optical simulation results agreed with the experimental spectra. Using the optical constants (i.e., n and k values) of the materials, absorption spectra of the multi-layer stack structure were calculated based on extraction of the transmission (T) and reflection (R) at each of the interfaces between different layers. The T and R values were obtained by calculating series of matrix components composed of the Fresnel complex reflection and transmission at the interface. Then, the average energy dissipation rate $Q_j(x, \lambda)$ in the $j^{th}$ layer at incident wavelength λ and at the position x in the thin layers was found $$Q_j(x, \lambda) = \frac{2\pi c \varepsilon_0 k_j n_j}{\lambda} |E_j(x)^2| \quad \text{[Mathematical Equation 3]}$$

wherein, $\varepsilon_0$ is the free space permittivity, subscript j denotes the $j^{th}$ layer, c is the speed of light in the free space, and $E_j(x)$ is the optical E-field at the position x. $Q_j(x,\lambda)$ can be translated into the effective absorption of the $j^{th}$ layer.

FIG. 6a shows the calculated spatial distributions of the squared optical E-field in the thin layers of the organic photovoltaic comprising the quaternary active layer for different incident wavelengths.

In this regard, FIG. 6b shows optical absorption spectra of the respective layers in the organic photovoltaic. Based on the E-field distribution profiles, it is evident that the active layer absorbs most of the incident solar light spanning over the broad range of wavelength (300 to 800 nm), as shown in FIG. 6b.

FIG. 6c shows the spatial distribution of the exciton generation rate (G(x)) in the active BHJ layer with different incident wavelengths assuming an AM 1.5G irradiation condition. FIG. 6d shows a total position-dependent exciton generation rate ($G_{ex}$).

Under AM 1.5G condition, it is possible to calculate the exciton generation rate G(x, λ), using the energy dissipation rate in the layers as in the following Mathematical Formula 4:

$$G_j(x, \lambda) = \frac{\lambda}{hc} Q_j(x, \lambda) \quad \text{[Mathematical Formula 4]}$$

wherein h is the Planck constant.

The total exciton generation rate, $G_{ex}(x)$, can be calculated such that $G_{ex}(x) = \int G_j(x,\lambda)d\lambda$, which, in turn, provides the expected exciton generation rate in the active layer, $G_{ex}$. It was found that $G_{ex} = \int_0^{90\,nm} G_{ex}(x)dx = 1.21 \times 10^{28}$ $m^{-3}$ $s^{-1}$ for the quaternary organic photovoltaic under AM 1.5G condition, which is in a good agreement with the experimentally measured value of $(1.006 \pm 0.224) \times 10^{28}$ $m^{-3}$ $s^{-1}$.

Test for Composition-Dependent Color Tunability of BHJ Blend

The device was tested for absorption spectrum and color tunability by controlling PTB7/PCDTBT and $PC_{71}BM/PC_{61}BM$ ratios in the quaternary BHJ layers and the results are depicted in FIG. 7. FIG. 7 shows UV-Vis-NIR absorption spectra of active layers consisting of different donor-acceptor BHJ compositions with varying polymer or fullerene concentrations.

FIG. 7a shows spectra for $PTB7:PCDTBT:PC_{71}BM$ blends with different PTB7 fractions and FIG. 7b shows spectra for $PTB7:PCDTBT:PC_{71}BM:PC_{61}BM$ blends as a function of $PC_{71}BM$ content with the ratio of PTB7:PCDTBT fixed at 0.9:1.

As can be seen, the color of the device can be tuned by controlling contents of the components in the quaternary composition. Such color tunability is particularly advantageous for aesthetic applications such as colorful building-integrated photovoltaics (BIPVs) or luminescent smart windows.

Figure 8:
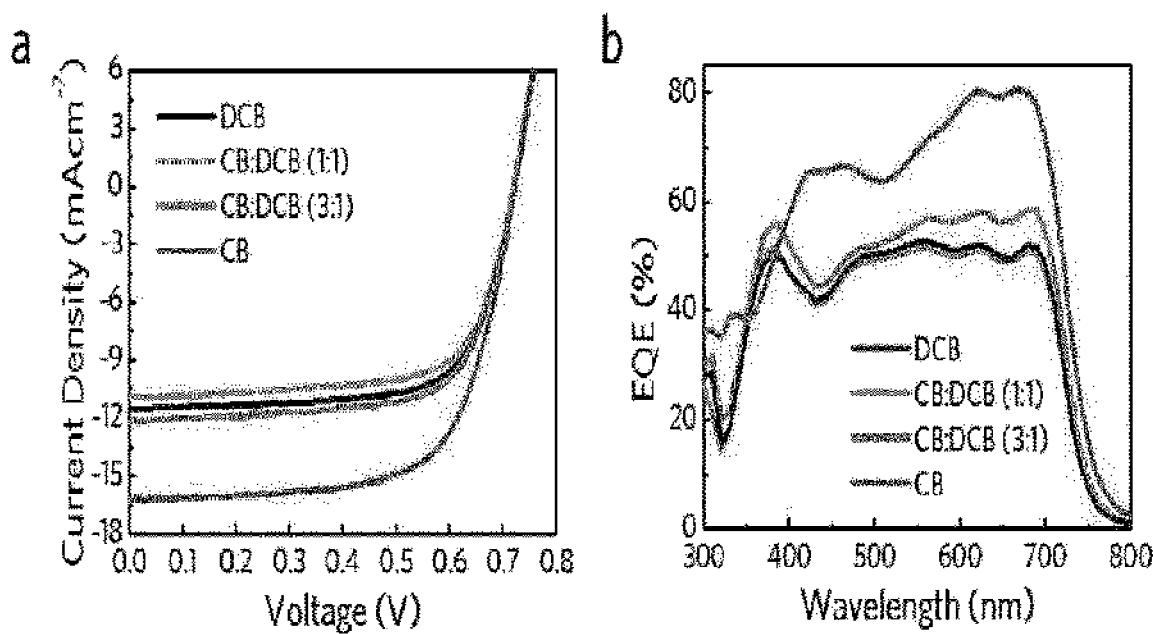

Test for Optimization of Composition for Organic Photovoltaic Comprising Quaternary Active Layer Selection of Optimum Solvent To find the optimized composition of the organic photovoltaics provided with the quaternary active layer, the ratio of donors in the mixture was varied on the basis of the best binary donor-acceptor (D-A) ratio of 1:1.5 (by mass), in such a way that $PTB7:PCDTBT:PC_{71}BM=1-x:x:1.5$ (wherein 0≤x≤1). Results for optimum solvents with different solvent compositions are depicted in FIG. 8.

FIG. 8a shows J-V characteristics and FIG. 8b shows EQE spectra of a binary ($PTB7:PC_{71}BM$) active layer-equipped organic photovoltaic processed with different solvent compositions (CB and DCB denote chlorobenzene and 1,2-dichlorobenzene, respectively).

As can be seen, chlorobenzene was regarded as a good solvent for the reference $PTB7:PC_{71}BM$ blend.

Optimization of Composition of Blend for Active Layer in Organic Photovoltaic

It was more practical to find the optimized composition by varying the relative amounts of the two donor components while keeping the amount of the acceptor fixed because this strategy yielded more possibilities for designing the optical and morphological properties of the active layer than did an alternative strategy involving varying the amounts of the acceptors. On the basis of the optimum composition 1:1.5 (by mass) of the binary donor-acceptor (D-A), experiments were carried out by varying the composition of the other components.

FIGS. 9a and 9b show photovoltaic parameters as a function of PCDTBT concentrations (x, 0≤x≤1) in PTB7:PCDTBT:PC$_{71}$BM (1-x:x:1.5) blends and FIGS. 9c and 9d show PC$_{61}$BM concentrations (y, 0≤y≤1.5) in PTB7:PCDTBT:PC$_{71}$BM:PC$_{61}$BM blends (0.9:0.1:1.5-y:y) (mean values calculated using data from 16 cells or more). In addition, FIGS. 9e and 9f show EQE spectra and $J_{ph}$-$V_{eff}$ characteristics of binary, ternary, and quaternary organic photovoltaics, respectively.

As apparent from FIGS. 9a and 9b, 0.1≤x≤0.2 would be responsible for achieving maximum short-circuit current density (Jsc) and fill factor (FF). In contrast, $V_{OC}$ slightly increased with increasing x.

When combined, the foregoing results show a maximum PCE at x=0.1.

After the composition of the donor components were optimized, PC$_{61}$BM was introduced as an additional acceptor component to further improve performance and establish quaternary D-A BHJs. In addition, this approach facilitated controlling the nanoscale morphology of the quaternary BHJ. It can be conjectured that the additional donor (D) and acceptor (A) would interfere with the formation of either crystalline grains of donor polymers or aggregated domains of acceptor fullerenes. Accordingly, the phase separation would be effectively controlled by the morphology to derive long-term and thermal stability.

The ratio of the acceptors in the mixture were varied while fixing the overall donor-to-acceptor ratio such that PTB7:PCDTBT:PC$_{71}$BM:PC$_{61}$BM=0.9:0.1:1.5-y:y (0≤y≤1.5) FIGS. 9c and 9d compares the dependence of the photovoltaic parameters of quaternary organic photovoltaics on y. Increasing the PC$_{61}$BM fraction resulted in higher FF values but lower $J_{sc}$ values. The open-circuit voltages ($V_{OC}$) did not vary much as y was changed.

It is also notable that the quaternary organic photovoltaic exhibited enhanced external quantum efficiency (EQE) spectra compared with those of the ternary and binary organic photovoltaics, as depicted in FIG. 9e. The enhancement corresponded to the increase in the photocurrent generated in the quaternary organic photovoltaic under the broad spectrum of solar irradiation. The photocurrent density-to-effective voltage ($J_{ph}$-$V_{eff}$) characteristics, shown in FIG. 9f, were in accordance with the EQE result.

Parameters associated with capabilities of photon absorption and exciton dissociation in active layers were obtained from the $J_{ph}$-$V_{eff}$ characteristics depicted in FIG. 9f, and the result are summarized in Table 2, below. In order to quantify the photocurrent generation and its efficiency from the $J_{ph}$-$V_{eff}$ data of Table 2, maximum exciton generation rate ($G_{max}$) and dissociation probability (P(E,T)) were calculated, where E and T denote the electric field and temperature, respectively.

In the table, $J_{ph}$ was obtained from $J_L$-$J_D$ and $J_{sat}$, $G_{max}$ and P(E,T) denote the saturation current density, maximum exciton generation rate, and charge dissociation probability, respectively.

Meanwhile, the enhancement of the fill factor (FF) would be attributed mainly to the balanced charge carrier mobilities when the fraction of PC$_{61}$BM was increased.

The charge carrier mobilities were measured as follows.

The hole and electron mobilities of devices with different annealing durations were measured by the space-charge-limited current (SCLC) method using hole-only devices and electron-only devices, respectively. The device structure of the hole-only device was ITO/PEDOT:PSS/active layer/MoO$_3$/Au while the electron-only device was composed of ITO/PFN/active layer/Al. The SCLC model is described by the following Mathematical Formula 5:

$$J_{SCLC} = \frac{9}{8}\varepsilon_0\varepsilon_r\mu_0\frac{V^2}{L^3}\exp\left(0.89\beta\frac{V}{L}\right) \quad \text{[Mathematical Formula 5]}$$

wherein $\varepsilon_0$ is the vacuum permittivity (8.85×10$^{12}$ F/m), $\varepsilon_r$ is the relative dielectric constant of the polymer blends (assumed as 3), $\mu_0$ is the zero-field mobility, L is the thickness of the active layer, and β is the characteristic field constant. The experimentally obtained J-V characteristics were plotted as ln(Jd$^3$/V$^2$) vs. (V/d)$^{0.5}$ to obtain $\mu_p$ through the slope and y-intercept value.

In relation thereto, FIG. 10a shows hole mobility ($\mu_h$)/electron mobility ($\mu_e$) ratios for pristine binary, ternary, and quaternary devices, and FIGS. 10b to 10d show the hole mobility ($\mu_h$)/electron mobility ($\beta_e$) ratio, hole mobility ($\mu_h$), and electron mobility at 65° C. for various points up to 24 hours. In particular, the hole/electron mobilities of FIG. 10a support the above-mentioned conclusion.

Ultimately, the PTB7:PCDTBT:PC$_{71}$BM:PC$_{61}$BM composition yielding the maximum PCE was experimentally found to be 0.9:0.1:1.2:0.3 (hereinafter, designated for quaternary organic photovoltaics).

The maximum PCE (8.42±0.12%) of the quaternary organic photovoltaic (q-OPV) was greater than those of other BHJ-OPVs including the 7.59±0.19% for the reference binary OPV made up of PTB7:PC$_{71}$BM (b-OPV) and even the 8.20±0.08% for the optimized ternary OPV made up of PTB7:PCDTBT:PC$_{71}$BM (t-OPV). The optimized quaternary composition was found to be responsible for the maximum $J_{sc}$ and fill factor (FF), as shown in Table 3, below.

TABLE 2

|  | PCDTBT b-OPV | PTB7 b-OPV | t-OPV | q-OPV |
| --- | --- | --- | --- | --- |
| $J_{ph}$ (A m$^{-2}$, short condition) | 85.7 | 157.0 | 161.4 | 163.1 (±4.8) |
| $J_{sat}$ (A m$^{-2}$, short condition) | 93.1 | 163.8 | 169.0 | 170.0 (±7.4) |
| $G_{max}$ (m$^{-3}$ s$^{-1}$) | 6.886 × 10$^{27}$ | 9.692 × 10$^{27}$ | 1.001 × 10$^{28}$ | 1.006 × 10$^{28}$ (±0.04 × 10$^{28}$) |
| P(E,T) (%) | 92.05 | 95.85 | 95.50 | 97.36 (±1.41) |

TABLE 3

|  | PTB7 | PCDTBT | PC$_{71}$BM | PC$_{61}$BM | V$_{oc}$ (V) | J$_{sc}$ (mAcm$^{-2}$) | FF (%) | PCE (%) |
|---|---|---|---|---|---|---|---|---|
| PCDTBT b-OPV | — | 0.4 | 1.6 | — | 0.79 ± 0.02 | 8.99 ± 0.16 | 57.54 ± 0.01 | 4.07 ± 0.13 |
| PTB7 b-OPV | 1.0 | — | 1.5 | — | 0.72 ± 0.01 | 15.77 ± 0.19 | 67.29 ± 0.01 | 7.59 ± 0.19 |
| t-OPV | 0.9 | 0.1 | 1.5 | — | 0.73 ± 0.01 | 16.14 ± 0.23 | 69.26 ± 0.01 | 8.20 ± 0.08 |
| q-OPV | 0.9 | 0.1 | 1.2 | 0.3 | 0.74 ± 0.01 | 16.31 ± 0.17 | 70.25 ± 0.02 | 8.42 ± 0.12 |

In addition, FIG. 11 shows J-V characteristics of pristine PCDTBT-based binary OPV, t-OPV, and q-OPV.

Figure 6:
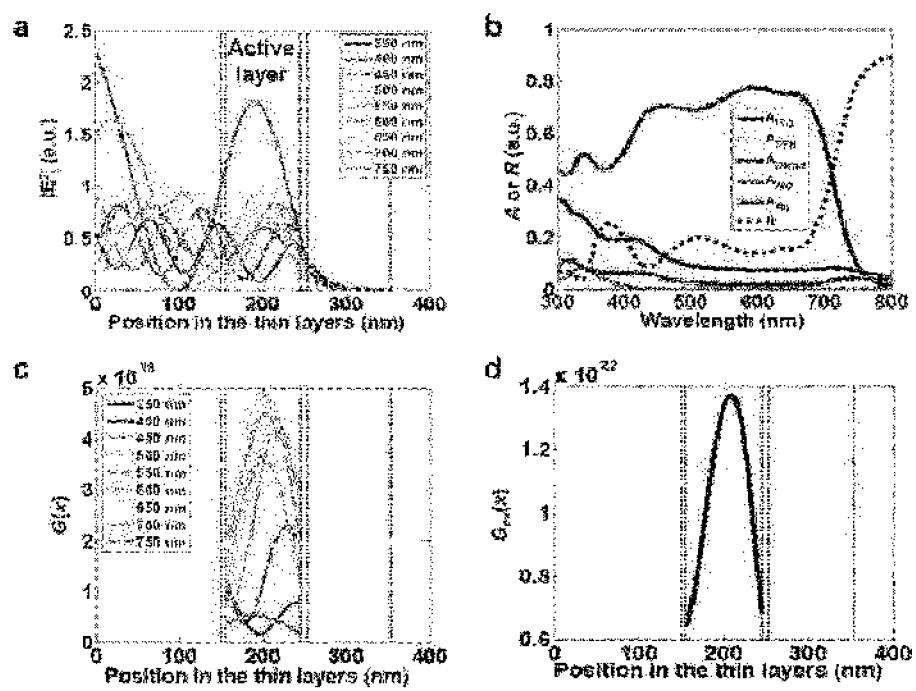

The calculated G$_{max}$ agreed with the optically simulated value based on the E-field distribution in the active layer depicted in FIG. 6 as described above. Moreover, the quaternary blend exhibited a nearly 100% dissociation probability (97.36%). The improved dissociation property in the quaternary device was primarily associated with the decreased domain size (and hence increased D-A interfacial areas) in the blend. The device characterizations revealed the advantages of the q-OPV for attaining superior photovoltaic performances.

Improvement of Stability in q-OPV Suppressing Early Loss in Performance

The q-OPV was beforehand confirmed to have sufficiently high efficiency and then examined for stability under elevated temperatures. The performance decay in OPVs is commonly characterized by two stages: (i) a drastic exponential decline in performance at an early stage of operation (known as burn-in loss period) and (ii) a subsequent gradual linear decay on a longer timescale.

Figure 12:
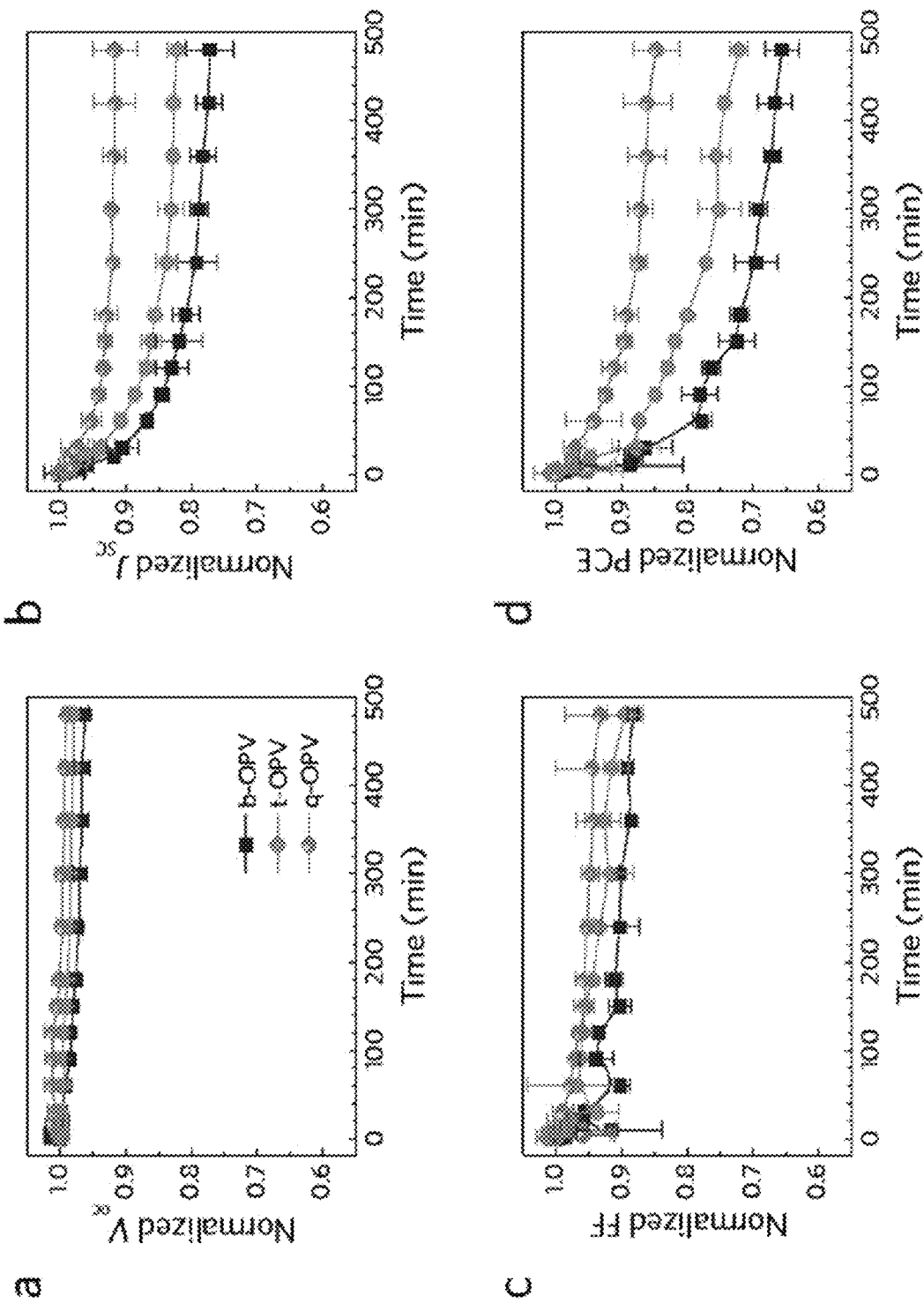

FIG. 12 shows suppressed effects on initial photovoltaic performance loss in the q-OPV.

FIGS. 12a to 12d shows V$_{OC}$, J$_{sc}$, FF, and PCE as a function of thermal treatment time (up to 8 hours) at 65° C. for b-, t-, and q-OPVs.

As shown in the figures, b-, t- and q-OPVs operating at 65° C. were observed to display the expected exponential decays in photovoltaic parameters at the early stages of exposure (the average and standard deviation values obtained from more than 12 devices). The operating temperature is within the usual range of temperatures that outdoor applications of PVs are exposed to, and is comparable to or higher than the glass transition temperatures of typical conjugated polymers.

The thermal stress at such real OPV operating temperatures initially induces nanoscale grain growth rather than micron-size features. As a result, it was assumed that the nanoscale grain growth and structural disorder increase contributed mainly to the observed abrupt decrease in J$_{sc}$ and FF. Compared with other parameters, V$_{OC}$ appeared to be nearly constant throughout the operation, which can be explained by the V$_{OC}$ being independent of the nano-grain growth.

Figure 13:
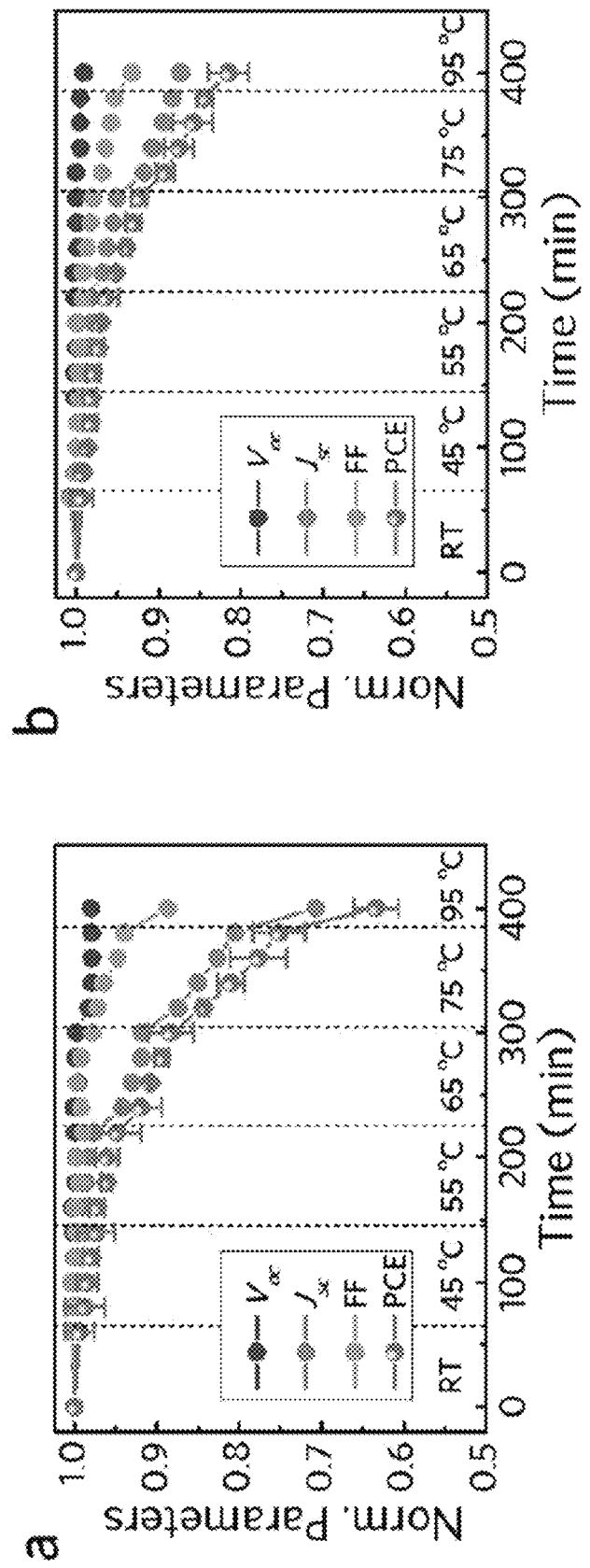

Consequently, the q-OPV retained a PCE of up to 84.7% of the initial value even after 8 hours of operation, and this value was much higher than the corresponding 72.1% and 65.6% values for the t- and b-OPVs, respectively. Interestingly, a heat-dependent property showed that the performance decay of the b-OPV was accelerated at around 65° C. while the q-OPV displayed a better resistance to the decay even at elevated temperatures over 65° C., as shown in FIG. 13.

FIGS. 13a and 13b show the normalized parameter loss for b-OPV and q-OPV, respectively, as a function of time and temperature. Device degradation was mainly derived from a loss in short-circuit current density (J$_{sc}$) as a function of time and was accelerated upon thermal treatment at around 65° C.

Figure 14:
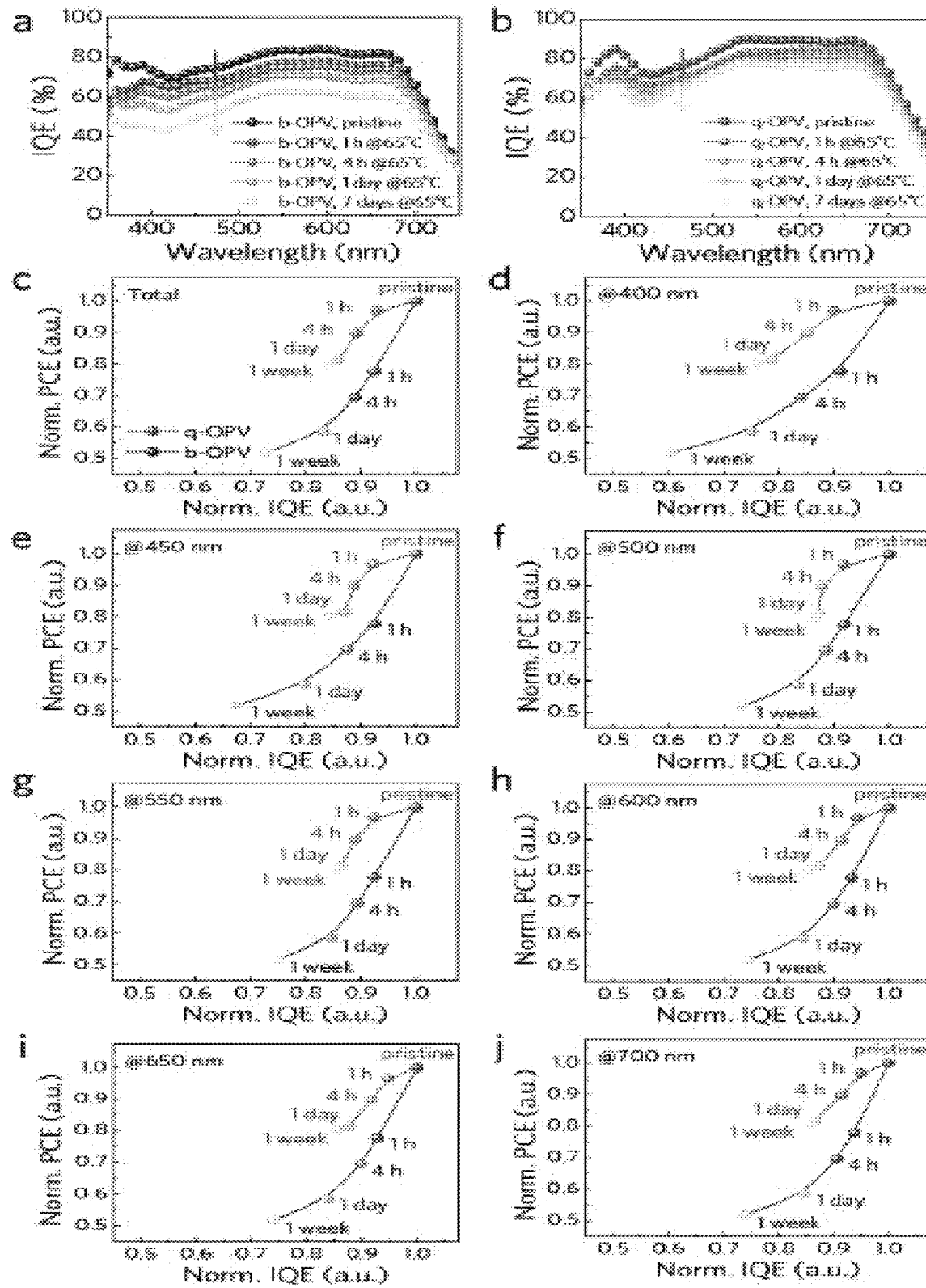

The enhanced internal quantum efficiency (IQE) spectrum in the q-OPV was consistent with the J-V result regardless of the duration of the operation. In this regard, time-dependent IQE spectra and IQE-PCE characteristics are depicted in FIG. 14.

FIGS. 14a and 14b show IQE spectra of b- and q-OPVs, respectively, with thermal annealing durations varying at 65° C. The IQE spectra were obtained based on IQE=EQE/(1-R-parasitic absorption), where the experimentally obtained spectral EQE and R values were used. The spectral parasitic absorption data are provided in FIG. 6b. FIGS. 14c to 14j shows normalized IQE vs. PCE characteristics of b- and q-OPVs at 65° C. as a function of incident wavelength and time. These results indicate that PCE is strongly correlated with the IQE, and the q-OPV exhibits high IQE regardless of the operation time.

Considering that IQE is associated with the internal carrier transport process (strongly governed by nanomorphology), the q-OPV was apparently superior in suppressing the undesirable nanoscale crystallization and aggregation of the donor polymers and fullerenes, respectively, in the early stages of the photovoltaic operation.

Then, to examine whether the nano-grain growth was impeded, 2D GIWAXS (two-dimensional grazing-incidence wide-angle X-ray scattering) analysis of the active layer measured at different operation times was carried out.

In this regard, 2D GIWAXS analysis was carried out according to the following procedure.

GIWAXS measurements were taken at the Pohang Accelerator Laboratory (PAL) using the 5 A beam line and the samples for measurements were prepared as follows:

The polymer-fullerene blends with different compositions of materials were applied onto ITO-glass/PFN substrate, followed by encapsulation in a nitrogen atmosphere before annealing. The angle of incident X-rays was 0.13° and the incident photon energy was 11.57 keV. To minimize air scattering, samples were mounted in a helium ambient chamber. The in-plane GIWAXS profiles were fitted to a superposition of four Pearson VII functions for organic materials peaks and one exponentially decaying profile for the background. The peaks were assigned based on Collins, B. A., Li, Z., Tumbleston, J. R., Gann, E., McNeill, C. R. & Ade, H. Absolute measurement of domain composition and nanoscale size distribution explains performance in PTB7: PC$_{71}$BM solar cells. Adv. Energy Mater. 3, 65-74 (2013), which is incorporated by reference herein.

Figure 15:
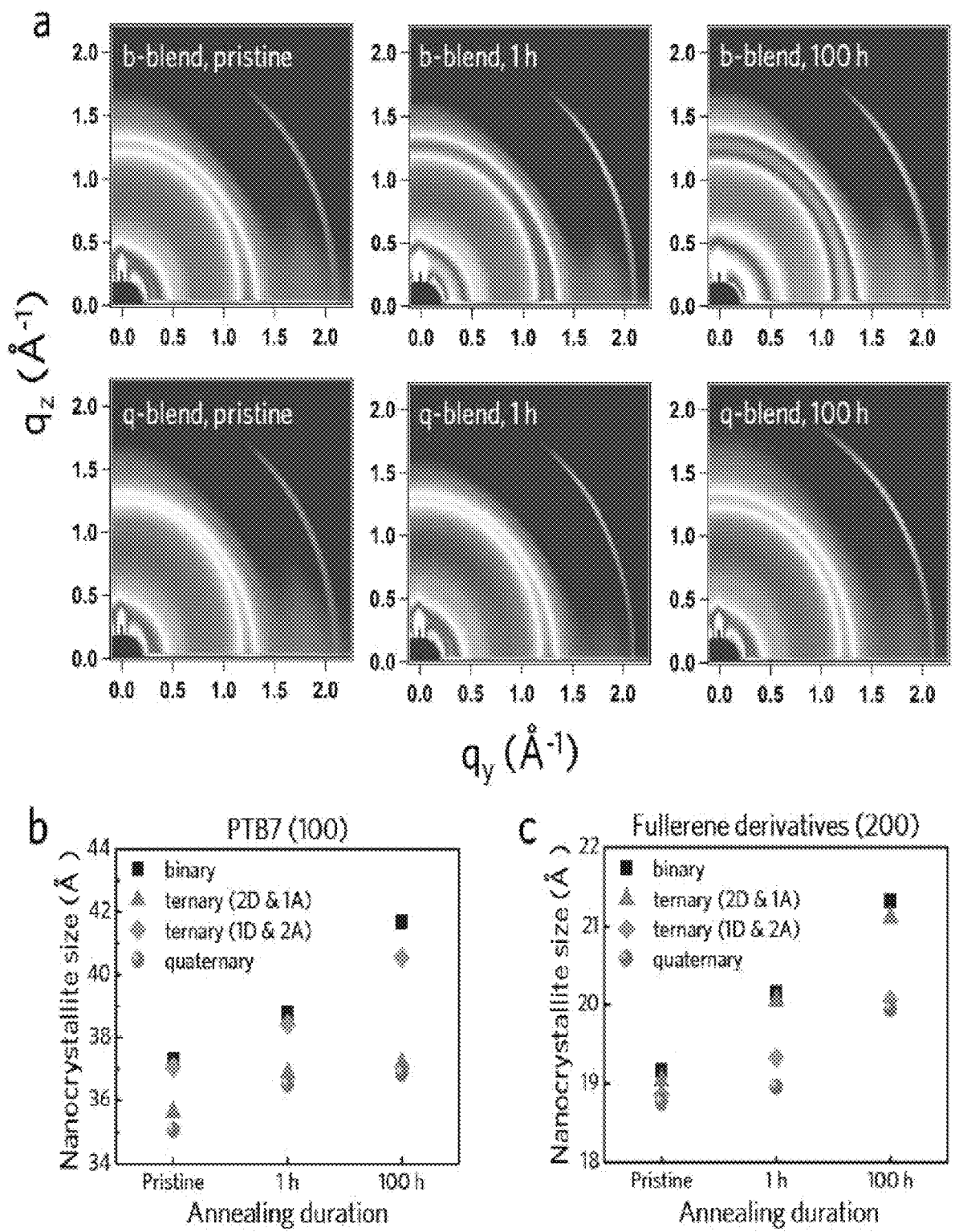

The 2D GIWAXS analysis results are depicted in FIG. 15. FIG. 15a shows 2D GIWAXS patterns of binary and quaternary BHJ blends for different annealing durations at 65° C. FIGS. 15b and 15c shows nanocrystallite sizes as a function of thermal treatment for b-, t- (2D & 1A or 1D &

2A), and q-blends according to PTB7 (100) and fullerene derivatives (200), respectively. The active layer of the ternary device (2D & 1A) consisted of PTB7:PCDTBT:$PC_{71}BM$ (0.9:0.1:1.5), while the ternary device (1D & 2A) was based on PTB7:$PC_{71}BM$:$PC_{61}BM$ (1.0:1.2:0.3).

As shown in FIG. 15a, an observation was made of common scattering patterns at the vicinity of $q_z=0.35$ Å$^{-1}$, which corresponds to the Bragg diffraction peak (out-of-plane scattering in (100) direction) of the crystallized PTB7 and ring patterns at the vicinity of q=1.32 Å$^{-1}$, which corresponds to the aggregation of fullerene derivatives: these 2D scattering patterns were assigned as a reference for further characterizations. A detailed characterization of the scattering peak positions and full-width at half-maximum (FWHM) values is provided in FIG. 16 and Table 4, below.

TABLE 4

|  |  | PTB7 | | | Fullerene derivatives | | |
| --- | --- | --- | --- | --- | --- | --- | --- |
|  |  | Peak (Å$^{-1}$) | FWHM (Å$^{-1}$) | Crystallite size (Å) | Peak (Å$^{-1}$) | FWHM (Å$^{-1}$) | Crystallite size (Å) |
| b-blend | Pristine | 0.36 | 0.159 | 37.29 | 1.31 | 0.316 | 19.16 |
|  | 1 h | 0.36 | 0.153 | 38.78 | 1.31 | 0.301 | 20.15 |
|  | 100 h | 0.35 | 0.142 | 41.67 | 1.30 | 0.284 | 21.32 |
| q-blend | Pristine | 0.35 | 0.169 | 35.07 | 1.34 | 0.323 | 18.76 |
|  | 1 h | 0.35 | 0.163 | 36.21 | 1.34 | 0.32 | 18.95 |
|  | 100 h | 0.35 | 0.161 | 36.86 | 1.33 | 0.304 | 19.94 |
| t-blend (2D & 1A) | Pristine | 0.35 | 0.166 | 35.64 | 1.30 | 0.318 | 19.04 |
|  | 1 h | 0.35 | 0.160 | 36.88 | 1.31 | 0.302 | 20.06 |
|  | 100 h | 0 35 | 0.159 | 37.18 | 1.31 | 0.287 | 21.12 |
| t-blend (1D & 2A) | Pristine | 0.35 | 0.160 | 37.06 | 1.34 | 0.321 | 18.86 |
|  | 1 h | 0.35 | 0.154 | 38.42 | 1.33 | 0.314 | 19.33 |
|  | 100 h | 0.36 | 0.146 | 40.53 | 1.33 | 0.302 | 20.06 |

In the figure and table, nano-grain sizes were calculated from the measured FWHM values and FF (0.94) by using the Scherrer equation.

FIG. 16 shows out-of-plane 2D GIWAXS line profiles as a result of the fitting each of the GIWAXS profiles of the binary, ternary, and quaternary BHJ blends with varying thermal treatment times at 65° C. for (a, d, g, and j) 0 hour (pristine), (b, e, h, and k) 1 hour, and (c, f, i and l) 100 hours. The red dotted lines accounts for experimental data, black solid lines for fits, blue lines for Lorentz peaks, and green lines for exponential backgrounds.

With reference to Table 4 and FIG. 16, as apparent from the calculated results, the nanoscale grain growth rate of both the polymers and fullerenes in the q-OPV was notably smaller than those of the t- and b-OPVs. Interestingly, the nanoscale crystallization of PTB7 was slowed down by the incorporation of PCDTBT (FIG. 15g), while the addition of PC71BM was less effective in impeding the PTB7 nanocrystallization. Similarly, the nanoscale aggregation size of fullerene derivative ($PC_{71}BM$) was also notably reduced when another fullerene derivative ($PC_{61}BM$) was included (FIG. 15c), while the addition of PCDTBT was less effective in slowing down the fullerene nanocrystallization. Both the nanoscale grain and its growth rate were effectively reduced in the q-OPV compared with the t- and b-OPVs.

The increases in both hole mobility ($\mu_h$) and electron mobility ($\beta_e$) were suppressed for the quaternary device, but not for the binary and ternary devices (see FIGS. 10b to 10d). Considering that the mobilities increased proportionally to the crystal domain size of donors and acceptors, this result clearly indicated a substantial inhibition of nanocrystallite growth in the quaternary device. Moreover, the quaternary device exhibited relatively balanced mobilities during the one day thermal treatment, also indicative of balanced charge transport and ideal domain size (see FIG. 10b).

Raman Spectroscopy Analysis

To uncover the origin of the reduction in the nanoscale grain growth rate in the q-OPVs, the Raman spectroscopy technique was used to explore vibrational modes of molecules and provide insight into polymer ordering and domain segregation. Raman analysis was conducted according to the following procedure.

The samples for Raman measurement were prepared as they had been for GIWAXS measurement. The Raman measurement was conducted using an inVia Raman microscope (Renishaw). The excitation source was 532 nm laser, and an acquisition time was minimized as 1 sec to reduce the photo-degradation of the polymer-fullerene blends during measurement. In order to interpret the changes in the Raman spectrum at around 1450 cm$^{-1}$, the first-principle calculations of PTB7 and PC71BM was performed by using the Plane-Wave Self-Consistent Field (PWscf) and PHonon codes of the Quantum ESPRESSO distribution with the projector-augmented wave (PAW) method and Perdew-Burke-Ernzerhof (PBE) exchange-correlation function. The energy cutoff of 50 Rydberg was used for the molecular structure relaxations and the Raman spectrum calculations.

Figure 17:
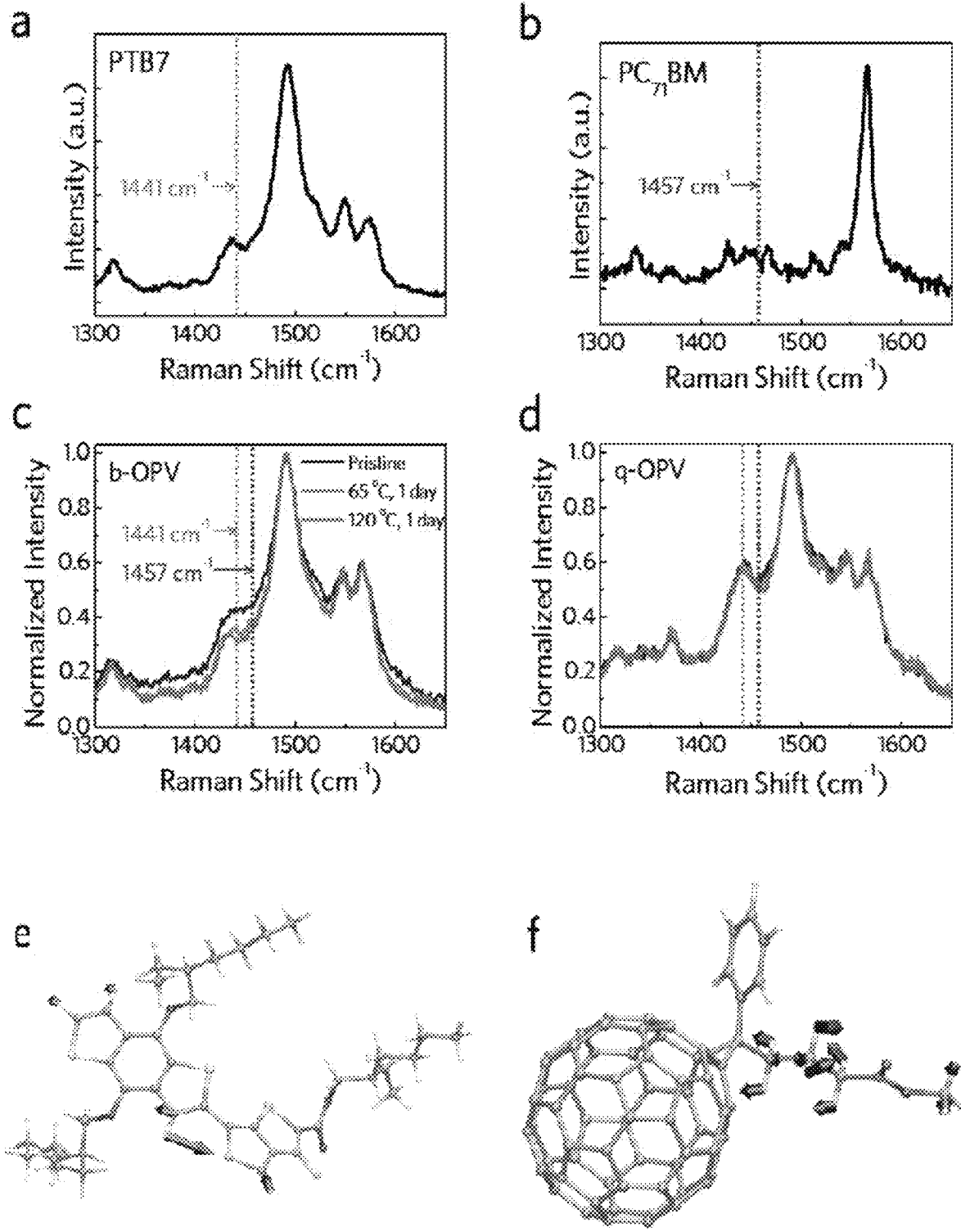

Based on the experimental results, two vibrational normal modes were considered at 1457 cm$^{-1}$ and 1441 cm$^{-1}$ for PC71BM and PTB7, respectively. FIG. 17 shows Raman analysis results. FIGS. 17a and 17b are Raman spectra of (a) pure PTB7 and (b) pure $PC_{71}BM$. FIGS. 17c and 17d show transitions in Raman spectra induced by applying thermal treatment for b- and q-blends, respectively. Here, the dotted vertical lines correspond to 1441 cm$_{-1}$ and 1457 cm$_{-1}$ for ease of comparison. The blue arrows in FIGS. 17e and 17f indicate major atomic vibrations for the two modes.

As shown in FIGS. 17a to 17d, the vibrational normal mode at 1,441 cm$^{-1}$ was assigned to the vibrations of hydrogen and carbon atoms of the conjugated rings of PTB7 and that at 1,457 cm$^{-1}$ to the vibrations of hydrogen and carbon atoms of the side-chain of PC71BM based on the first-principle calculations of the single molecule (see FIGS. 17e and 17f). A decrease of the Raman peaks with time was observed, indicative of a packing rearrangement of the molecules leading to the suppression of the vibration mode. Such a rearrangement is strongly related to the mechanism of phase segregation in the b-OPV upon thermal annealing. In contrast, the peak intensities of the two vibrational modes were distinctively maintained in the q-OPV. Combined with the 2D GIWAXS data, the Raman spectroscopy data implied that the introduction of PCDTBT and $PC_{61}BM$ to a certain extent effectively inhibited the growth of the donor and acceptor components.

Long-term Stability and Thermal Stability of q-OPV

OPVs were characterized and tested for long-term stability as follows.

The J-V characteristics of the OPVs were recorded using a source meter (Keithley 2400) under an Air Mass 1.5 Global (AM 1.5G) illumination with an intensity of 100 mWcm$^{-2}$. White light was provided by a solar simulator (XES-301S, SAN-EI ELECTRIC) with a 300 W Xe lamp. The light source was carefully adjusted by using a silicon reference cell calibrated by the National Renewable Energy Laboratory (NREL). The EQE spectra were monitored using a K3100 Spectral IPCE Measurement System equipped with a 300 W Xe light source and monochromator (McScience). The IQE spectra were obtained based on IQE=EQE/(1-R-parasitic absorption), where the experimentally obtained spectral EQE and R values were used. The film absorption spectra of the active layers prepared on a quartz substrate were obtained using a Cary 5,000 UV-Vis-NIR spectrophotometer (Varian). For the thermal stability test, the devices with full encapsulation were stored on a digital hot plate preheated to a desired temperature (65 or 120° C.) in dark ambient conditions, and the photovoltaic performance was obtained repeatedly under AM 1.5G illumination (repeated cycles of dark thermal annealing and device testing at room temperature). It was assumed that the performance decay primarily resulted from the degradation within the active layer under the thermal stress because effects from other external factors (for example, exposure to oxygen or humidity) were minimized after encapsulation. All measurements were conducted using encapsulated devices under ambient conditions unless otherwise stated.

Following the drastic reduction in the performance of the devices at first use (for example, within about 1 day), their performances then exhibited a moderate decrease over a longer timescale of more than 30 days. It has been conjectured that the long-term performance decay mechanism (after 1 day) would differ from that within one day. Accordingly, the OPVs annealed for one day were assigned as a reference for long-term stability analysis. In contrast to the mechanism for the initial (about 1 day) decay, the main mechanism for the long-term decay in the photovoltaic performances would be the diffusion-limited phase separation driven by coalescence, which is a process governed by spinodal decomposition of the immiscible blends. To compare in detail the phase-separated morphologies in the BHJs, extraction was made of the correlation length scale from the blends, which is strongly associated with the overall domain size.

Calculation of numerical domain sizes was conducted as follows.

For the detailed analysis of the phase-separated morphology of the BHJ active layer, the domain size was extracted using image-analysis of the 2D distribution of the orientation angle of the phase ($\varphi$) measured by AFM. The tapping-mode phase images of the active layers were obtained using an XE-100 AFM (Park Systems). Considering that the difference in the phase angle is proportional to the compositional difference, it is instructive to quantify the spatial scale of the composition distribution using the pair-correlation function, $g(r)$. This function may be defined by the following Mathematical Formula 6:

$$g(r) = \frac{1}{N}\sum_{r'} \langle \overline{\varphi}(r+r')\overline{\varphi}(r') \rangle \quad \text{[Mathematical Formula 6]}$$

The function allows for a determination of the long-range order of the system. In the mathematical formula, r is the 2D coordinates in the system, the bracket denotes values averaged over the system, and $\overline{\varphi}=\varphi-\varphi_{avg}$ where $\varphi_{avg}$ denotes the average value of $\varphi$. The obtained quantitative measure for the long-range order corresponds to the average domain size in the $i^{th}$ direction (i=x or y), $L_{cor,i}$, which can be obtained by calculating the smallest value of r satisfying $g(x)=0$ and $g(y)=0$, respectively. Then, the overall average domain size, $H_{inter}$, can be obtained using the reciprocal relationship $H_{inter}=(L_{cor,x}^{-2}+L_{cor,y}^{-2})^{-1/2}/2\pi$.

FIG. 18 shows results of a long-term morphological stability test under thermal treatment and FIG. 19 shows results of AFM analysis.

In FIG. 18, a set of 2D AFM phase images, pair-correlation functions (g(r)), and 2D FFT (fast Fourier transform) profiles for the b- and q-OPVs with varying annealing durations at a moderate temperature (65° C.) FIGS. 18a to 18c correspond to b-OPV for 1 day, FIGS. 18d to 18f to b-OPV for 30 days, FIGS. 18g to 18i to q-OPV for 1 day, FIGS. 18j to 18l to q-OPV for 30 days. For the AFM data, color bars denote the normalized phase angle and the scan area was 5×5 μm² (scale bars, 2 μm). FIGS. 18m and 18n show time-dependent PCE of b- and q-OPVs Time-dependent PCE decay relative to the reference PCE under the moderate annealing temperature of 65° C. and harsh annealing temperature of 120° C. for 30 days. The average values and error bars corresponding to the standard deviation were obtained from more than 12 cells.

FIG. 19 shows tapping-mode 2D AFM geometry and phase images of the binary and quaternary blends as a function of annealing temperature and time. The scan area was 5×5 μm² and scales bars denote 2 μm.

Of the drawings, FIGS. 18a, 18d, 18g, and 18j each show images of the 2D distributions of the orientation angle of the phase ($\varphi$), which were experimentally determined using atomic force microscopy (AFM) (see raw AFM images in FIG. 19).

By applying the 2D phase value ($\varphi(r)$) to the pair-correlation function (g(r)), the correlation lengths in the x ($L_{cor,x}$) and y ($L_{cor,y}$) directions were obtained (FIGS. 18b, 18e, 18h, and 18k).

With reference to the figures, the correlation length was found to increase in both the x and y directions more prominently in the b-OPV than in the q-OPV. This result was supported by analyzing the 2D FFT patterns of the AFM phase image. As shown in FIGS. 18c, 18f, 18i, and 18l, the radii of the concentric rings in the 2D FFT pattern of the q-OPV were maintained during thermal treatment at a larger value than were those in the b-OPV-derived 2D FFT pattern, implying suppressed phase separation in the q-OPV.

As a consequence of those analyses, the q-OPV was found to be advantageous in retaining a high PCE for the extremely extendable operation duration as can be seen in FIG. 18m. As indicated by the figure, the q-OPV exhibited a strong resistance to the performance reduction even after a one-month operation at 65° C. (for example, exceeding 95% of the reference PCE).

Figure 20:
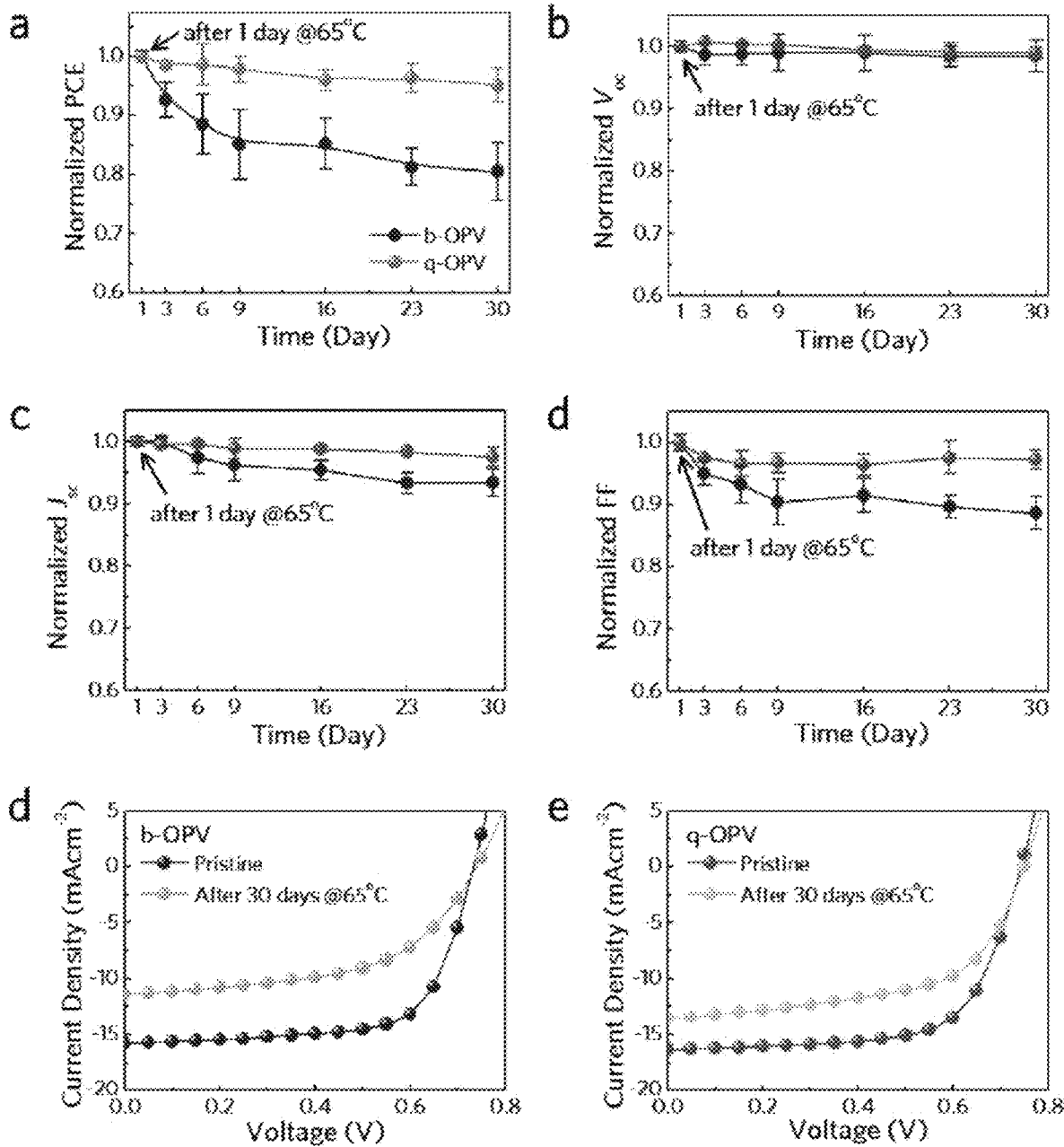

In relation thereto, FIG. 20 shows time-dependent OPV performance decay histories. FIGS. 20a to 20d show photovoltaic parameter decay as a function of storage time at 65° C. (the devices annealed for one day were assigned as a reference). FIGS. 20e and 20f are J-V curves of (e) b-OPV and (f) q-OPV before and after thermal treatment at 65° C. for 30 days.

In contrast to the foregoing results, the PCE of b-OPV fell to less than 80% of the reference PCE after this time period (see time-dependent $V_{OC}$, $J_{sc}$ and FF of b- and q-OPVs in FIG. 20).

Interestingly, the notable inhibition of phase separation in the q-OPV also occurred in harsh temperature conditions. The q-OPV after one month at 120° C. retained 72.4% of its reference PCE, in contrast to a retention of only about 58.3% for the b-OPV (FIG. 18n). This temperature (120° C.) sufficiently exceeds the operating temperature of photovoltaics running outside (as high as 95° C.) (see FIG. 21).

Figure 22:
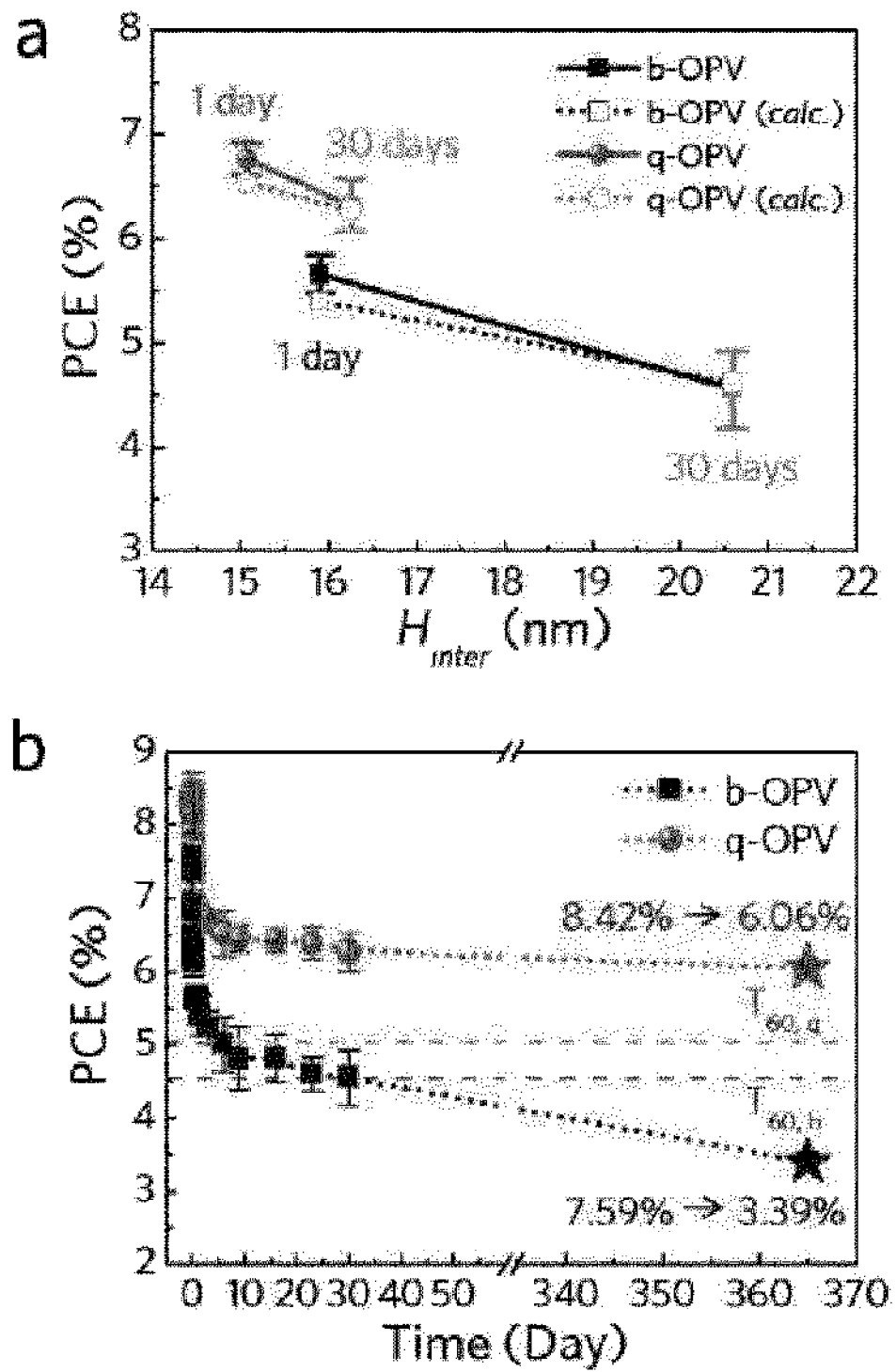

Next, the overall average domain size ($H_{inter}$) was obtained from the calculated correlation length scale. In relation thereto, test results of long-term durability are depicted in FIG. 22.

FIG. 22a shows time-dependent PCE-$H_{inter}$ characteristics of b- and q-OPVs. The calculated PCE values were derived from the time-dependent $H_{inter}$ by using the modified drift-diffusion equation together with the Poisson equation. FIG. 22b shows long-term PCE decay of b- and q-OPVs at 65° C. The PCEs after one year (marked with star) are theoretically obtained by extrapolating the $H_{inter}$. The horizontal dashed lines indicate the $T_{60}$ point (defined as the point at which the PCE has fallen to 60% of the value obtained after one day operation) for the b- and q-OPVs. The combined experimental and calculated results suggested that the q-OPV after one year would display a PCE of 6.06%, retaining 72.0% of its initial value, whereas the b-OPV would suffer from a much more substantial PCE loss, retaining 44.7% of its initial value.

As can be seen in FIG. 22a, the q-OPV exhibited a notably smaller average phase-separated domain as well as suppressed domain growth after 30 days compared with the b-OPV (for example, an increase in $H_{inter}$ by 7.83% for the q-OPV versus 29.50% for the b-OPV at 65° C.)

The q-OPV also exhibited such beneficial features under the extremely harsh temperature condition (120° C.) as seen in FIG. 23.

FIG. 23 shows domain growth analysis with varying operating temperatures, with comparison of $H_{inter}$ and PCT of b- and q-OPVs as a function of annealing temperature for one day.

For the multi-component mixture (for example, having two or more D-A pairs), it is known that the difference between the diffusivities of each component induces a kinetic trapping effect that slows down the separation rate. For the q-OPV, the slowed-down phase separation also gave rise to a wider size distribution of nanodomains than did the b-OPV, which was also attributed to the greater difference between the diffusivities of the donor and the acceptor. This greater difference resulted in the kinetic trapping effect, which decreased the rate of phase separation. To compare the rates of phase separation of the b- and q-OPVs, the well-known kinetic model for the phase-separated domain governed by spinodal decomposition was employed such that $H_{inter}(t)=H_{inter}(t_0)+C(t-t_0)^{1/3}$ (wherein C is the kinetic factor related to the Onsager mobility of the material and $t_0$ is the reference time (chose here to be one day). As a result of the analysis, it was found that the C was 0.382 day$^{-1/3}$ for the q-OPV, a value four times smaller than the 1.52 day$^{-1/3}$ for the b-OPV.

Notably, the phase separation rate ($\Gamma_e$) can be derived from the relationship $\Gamma_c=1/t_c$, wherein the characteristic timescale for the phase separation ($t_c$) can be obtained from the relationship $t_c=t_0+C^{-3}$ based on $H_{inter}(t)=H_{inter}(t_0)+[(t-t_0)/(t_c-t_0)]^{1/3}$. Quantitatively, using the calculated C, it was found that the phase separation rate for the q-OPV was much slower than that for the b-OPV by a factor of 14.7 (for example, $\Gamma$c: 0.053 day$^{-1}$ for the q-OPV versus 0.779 day$^{-1}$ for the b-OPV). It has been well known that the domain size and its growth rate are strongly associated with the photovoltaic performance. An additional work progress was made to numerically obtain the photovoltaic parameters that depend on the $H_{inter}$ (influencing the exciton transport dynamics). To this end, the modified drift-diffusion equation for the charge carriers and the Poisson equation for the electric potential were utilized. From the numerical calculations, the time-dependent open-circuit voltage ($V_{OC}$), short-circuit current density ($J_{sc}$), fill factor (FF), and power conversion efficiency (PCE) values can be obtained from the $H_{inter}$. The results are depicted in FIG. 24.

FIG. 24 depicts time-dependent $H_{inter}$ and $H_{inter}$-derived photovoltaic parameters. FIGS. 24a to 24d respectively show time-dependent $V_{OC}$, $J_{sc}$, FF, and PCE values of the b-OPV (solid blue square) and q-OPV (solid red circle) calculated from the $H_{inter}$ (open blue square for b-OPV and open red circle for q-OPV) via employing the modified drift-diffusion and Poisson equations.

In FIG. 24d, the solid green square and solid orange circle indicate the experimentally measured PCEs of the b- and q-OPVs, respectively. The calculated PCE values nearly completely matched the experimental values, as shown in FIG. 24a.

As discussed above, the employed model could be statistically verified in analyzing the effect of the change in morphology on the photovoltaic parameters. Additional application was made of the model to anticipate the long-term (for example, one year) thermal stability of the q-OPV. By extrapolating the $H_{inter}$ the photovoltaic parameters as well as the life expectancy of OPVs for such a long duration operation can be obtained.

FIG. 22b shows the experimentally measured PCE (during one month) and the calculated PCE (after one year). The q-OPV was expected to retain more than 72.0% of its initial PCE after one year of operation at 65° C. (that is, a PCE of 6.06%). In contrast, at the same conditions, the b-OPV was expected to retain only 44.7% of its initial PCE (that is, a PCE of 3.39%).

Notably, it is strongly expected that the q-OPV will not reach the $T_{60}$ point even after one year of operation, whereas the b-OPV was estimated to reach the $T_{60}$ point within one month. Therefore, a highly extended life expectancy of more than several years can be anticipated for the q-OPV. The long-term stability of the q-OPV and its superior photovoltaic performances strongly suggest that this OPV can be used in outdoor applications with commercially acceptable quality.

While the present invention has been described with reference to the embodiments, it will be understood by a person skilled in the art that the present invention may be changed and modified without departing from the scope of the present invention.

The invention claimed is:

1. An at least quaternary composition for use in an active layer of an organic photovoltaic, the composition comprising:
   (I) a donor component including a first donor component and a second donor component that absorb light to create an exciton and donate the electron separated from the exciton formed; and (II) an acceptor component including a first low-molecular-weight fullerene acceptor component and a second low-molecular-weight fullerene acceptor component that receive the electron donated by the donor component,
   wherein, the first donor component is a material having a bandgap of 1.1 to 2.5 eV,
   the second donor component is a material having a LUMO (lowest unoccupied molecular orbital) identical to or lower than a LUMO of the first donor component,
   the first low-molecular-weight fullerene acceptor component has a cascade energy level structure with the second donor component and the second donor component has a HOMO (highest occupied molecular orbital) identical to or higher than a HOMO of the first low-molecular-weight fullerene acceptor component, and
   the second low-molecular-weight fullerene acceptor component has a cascade energy level structure with the first low-molecular-weight fullerene acceptor component and a LUMO higher than the HOMO of the first low-molecular-weight fullerene acceptor component.

2. The at least quaternary composition of claim 1, wherein the donor component (I) and the acceptor component (II) are contained at a mass ratio of 1:1 to 1:3 in the at least quaternary composition, the content of the first donor component in the donor component (I) ranges from 1 to 99% by mass, and the content of the first low-molecular-weight fullerene acceptor component in the acceptor component (II) ranges from 1 to 99% by mass.

3. The at least quaternary composition of claim 1, further comprising chlorobenzene, chloroform, para-xylene, dichlorobenzene, trichlorobenzen, hexane, THF, or a combination thereof as an organic solvent for forming a layer in an organic photovoltaic.

4. The at least quaternary composition of claim 3, wherein the organic solvent is contained in an amount of 1 to 4% by mass on the basis of the total mass of the at least quaternary donor and acceptor components.

5. The at least quaternary composition of claim 1, wherein the LUMO of the second donor component is lower by up to 50% than that of the first donor component and higher by at least 0.3 eV than that of the first low-molecular-weight fullerene acceptor component.

6. The at least quaternary composition of claim 1, wherein the HOMO of the second donor component is higher by at least 0.3 eV than that of the first low-molecular-weight fullerene acceptor component.

7. The at least quaternary composition of claim 1, wherein the second low-molecular-weight fullerene acceptor component has the LUMO lower than that of the first donor component.

8. The at least quaternary composition of claim 1, wherein the LUMO of the second low-molecular-weight fullerene acceptor component is higher by up to 50% than the HOMO of the first low-molecular-weight fullerene acceptor component and lower by at least 0.3 eV than the LUMO of the first donor component.

9. The at least quaternary composition of claim 1, wherein a HOMO of the second low-molecular-weight fullerene acceptor component is lower than a LUMO of the first low-molecular-weight fullerene acceptor component.

10. The at least quaternary composition of claim 1, wherein a HOMO of the second low-molecular-weight fullerene acceptor component is lower by up to 50% than a LUMO of the first low-molecular-weight fullerene acceptor component.

11. The at least quaternary composition of claim 1, wherein the first donor component and the second donor component range in bandgap from 1.1 to 2.5 eV and from 1.2 to 2.6 eV, respectively.

12. The at least quaternary composition of claim 1, wherein the first low-molecular-weight fullerene acceptor component and the second low-molecular-weight fullerene acceptor component range each in bandgap from 1.5 to 2.5 eV.

13. The at least quaternary composition of claim 1, wherein the first donor component is poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]]; PTB7).

14. The at least quaternary composition of claim 1, wherein the first donor component is a polymer material comprising the repeating unit represented by one of the following General Formulas 2 to 5 or a combination thereof:

[General Formula 2]

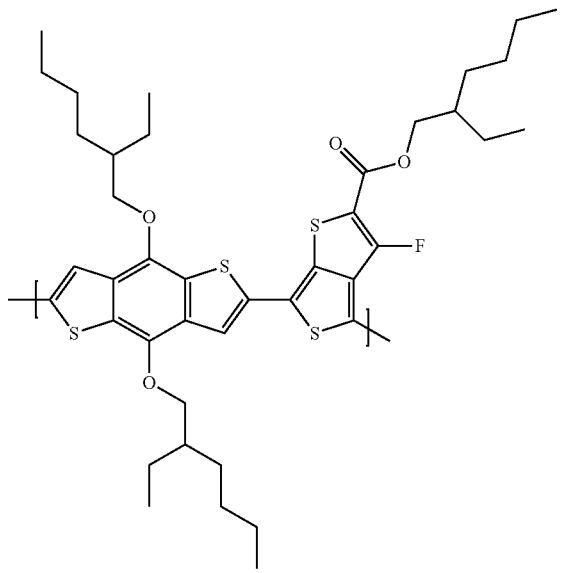

[General Formula 3]

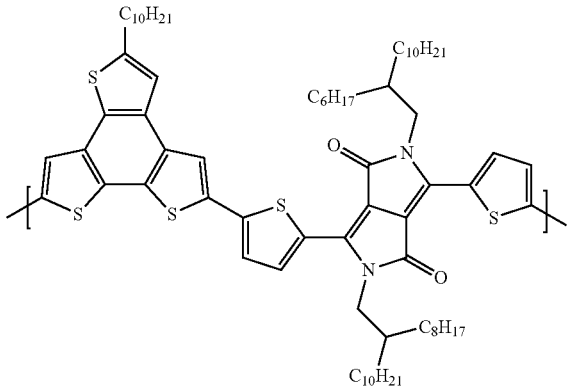

[General Formula 4]

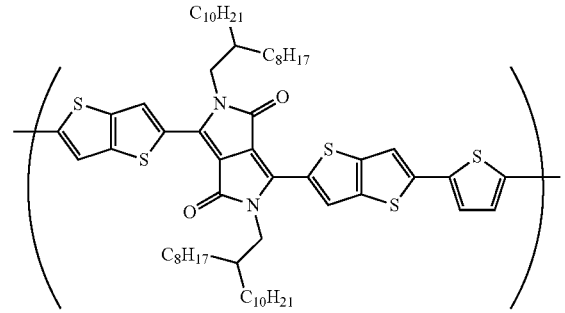

-continued

[General Formula 5]

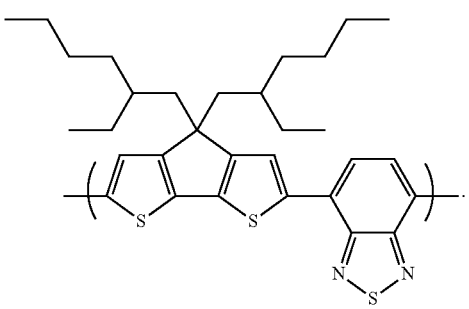

15. The at least quaternary composition of claim 1, wherein the first donor component is a polymer having a molecular weight (Mw) of 10,000 to 500,000.

16. The at least quaternary composition of claim 1, wherein the second donor component is PCDTBT, F8TBT, PPV, MDMO-PPV, MEH-PPV, P3HT, PBDTTT-CF, F8BT, PSBTBT, PBTTPD, TQ1, or a combination thereof and has a molecular weight (Mw) of 10,000 to 500,000.

17. The at least quaternary composition of claim 1, wherein the first low-molecular-weight fullerene acceptor component is C60, C70, C84, $PC_{71}BM$, $PC_{61}BM$, ICBA, ICMA, [6,6]-Thienyl C61 butyric acid methyl ester, or a combination thereof.

18. The at least quaternary composition of claim 1, wherein the second low-molecular-weight fullerene acceptor component is C60, C70, C84, $PC_{71}BM$, $PC_{61}BM$, ICBA, ICMA, [6,6]-Thienyl C61 butyric acid methyl ester, or a combination thereof.

19. The at least quaternary composition of claim 1, having a pristine hole mobility ($\mu_h$)/electron mobility ($\mu_e$) ratio of 0.8 to 2.

20. An organic photovoltaic, comprising:
a pair of electrodes including a cathode and an anode different in work function from each other; and
an active layer disposed between the pair of electrodes, wherein the active layer comprises the at least quaternary composition according to one of claim 1.

* * * * *